(12) United States Patent
Chiang et al.

(10) Patent No.: US 7,977,161 B2
(45) Date of Patent: Jul. 12, 2011

(54) METHOD OF MANUFACTURING A SEMICONDUCTOR PACKAGE USING A CARRIER

(75) Inventors: Chau Fatt Chiang, Melaka (MY); Hsieh Ting Kuek, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 12/292,343

(22) Filed: Nov. 17, 2008

(65) Prior Publication Data

US 2010/0124802 A1    May 20, 2010

(51) Int. Cl.
*H01L 21/00* (2006.01)

(52) U.S. Cl. ............. 438/124; 438/126; 257/E21.502

(58) Field of Classification Search ............ 438/124, 438/126; 257/E21.502
See application file for complete search history.

(56) References Cited

U.S. PATENT DOCUMENTS

| | | | |
|---|---|---|---|
| 4,615,857 A | 10/1986 | Baird | |
| 5,756,379 A * | 5/1998 | Haghiri-Tehrani | 438/126 |
| 6,159,770 A | 12/2000 | Tetaka et al. | |
| 2005/0148117 A1 | 7/2005 | Huang | |
| 2005/0218499 A1* | 10/2005 | Chang et al. | 257/690 |
| 2005/0224968 A1* | 10/2005 | Ho | 257/737 |
| 2008/0224293 A1* | 9/2008 | Hin | 257/685 |

* cited by examiner

*Primary Examiner* — Hsien-ming Lee
*Assistant Examiner* — Kevin Parendo
(74) *Attorney, Agent, or Firm* — Dicke, Billig & Czaja, PLLC

(57) ABSTRACT

A method of manufacturing a semiconductor package includes providing a carrier, forming a post slot and a terminal slot in the carrier, depositing a post in the post slot, depositing a terminal in the terminal slot, forming an encapsulant slot in the carrier, wherein the post extends into and is located within a periphery of the encapsulant slot and the terminal extends into the encapsulant slot, mechanically attaching a semiconductor chip to the post, electrically connecting the chip to the terminal, depositing an encapsulant in the encapsulant slot, and removing the carrier from the terminal.

23 Claims, 28 Drawing Sheets

US 7,977,161 B2

METHOD OF MANUFACTURING A SEMICONDUCTOR PACKAGE USING A CARRIER

FIELD OF THE INVENTION

The present invention generally relates to semiconductor packaging, and more particularly to a method of manufacturing a semiconductor package that includes a chip, a terminal and an encapsulant using a carrier.

BACKGROUND OF THE INVENTION

Semiconductor chips include input/output pads that are electrically connected to external circuitry such as terminals in order to function as part of an electronic system. The terminals are typically a lead array such as lead frame. The electrical connections between the chip and the terminals is often achieved by wire bonding, tape automated bonding (TAB) or flip-chip bonding.

Semiconductor packages typically include the chip, the terminals, the electrical connections and an encapsulant. The terminals extend through the encapsulant and are exposed to the external environment for electrical connection to a substrate such as a printed circuit board (PCB), and the encapsulant protects the chip from the external environment to ensure reliability and performance.

Semiconductor packages are often referred to as leaded or leadless packages. In leaded packages, the terminals (or leads) protrude from the encapsulant, whereas in leadless packages, the terminals are aligned with the encapsulant. For instance, ball grid array (BGA) packages contain an array of solder balls to post on corresponding metal traces on a printed circuit board, and land grid array (LGA) packages contain an array of contact pads that receive corresponding solder traces on a printed circuit board.

Semiconductor packages are typically manufactured with a process dedicated to leaded or leadless packages. A process that provides both leaded and leadless packages in a reliable and convenient manner is highly desirable.

Therefore, there is a need for an improved method of manufacturing a semiconductor package that has high performance, high reliability, low thickness, low manufacturing cost and is readily provided as a leaded and leadless package.

SUMMARY

The present invention provides a method of manufacturing a semiconductor package that includes providing a carrier, forming a post slot and a terminal slot in the carrier, depositing a post in the post slot, depositing a terminal in the terminal slot, forming an encapsulant slot in the carrier, wherein the post extends into and is located within a periphery of the encapsulant slot and the terminal extends into the encapsulant slot, mechanically attaching a semiconductor chip to the post, electrically connecting the chip to the terminal, depositing an encapsulant in the encapsulant slot, and removing the carrier from the terminal.

These and other features and advantages of the present invention will become more apparent in view of the detailed description that follows.

BRIEF DESCRIPTION OF THE DRAWINGS

Preferred embodiments of the present invention will now be more fully described, with reference to the drawings in which.

DETAILED DESCRIPTION OF THE INVENTION

In the following description, the preferred embodiments of the present invention are described. It shall be apparent to those skilled in the art, however, that the present invention may be practiced without such details. Some of the details are not be described at length so as not to obscure the present invention.

FIGS. 1A-1N, 2A-2N and 3A-3N are cross-sectional, top and bottom views, respectively, of a method of manufacturing a semiconductor package in accordance with a first embodiment of the present invention. In the first embodiment, the semiconductor package is a leaded package.

Figure 1A:
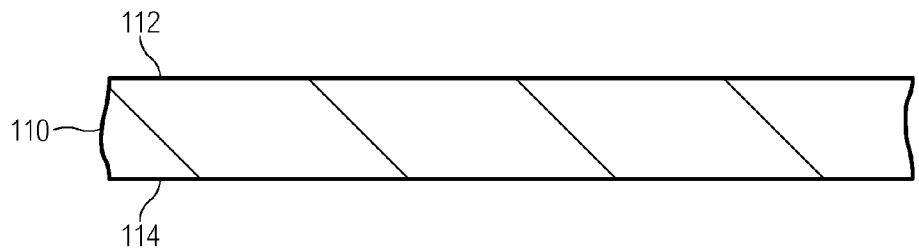
FIGS. 1A-1N are cross-sectional views of a method of manufacturing a semiconductor package in accordance with a first embodiment of the present invention.
Figure 2A:
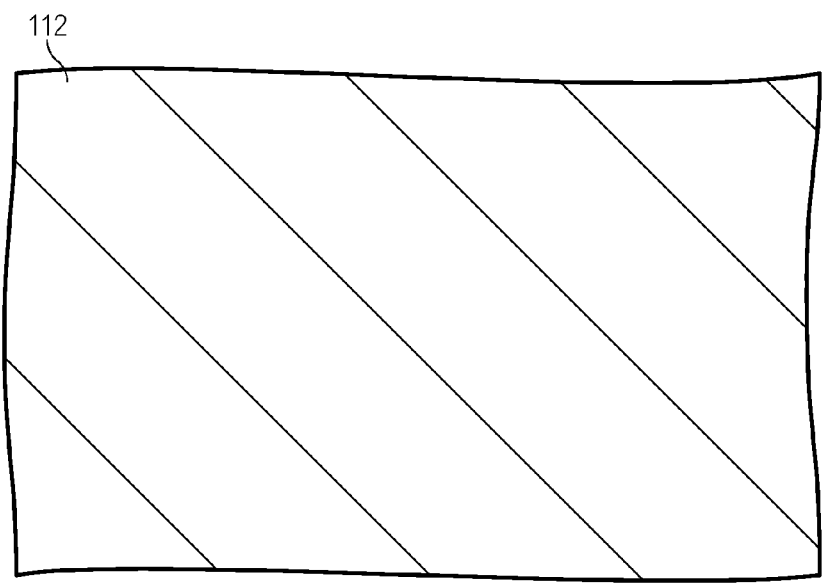
FIGS. 2A-2N are top views that correspond to FIGS. 1A-1N, respectively.
Figure 3A:
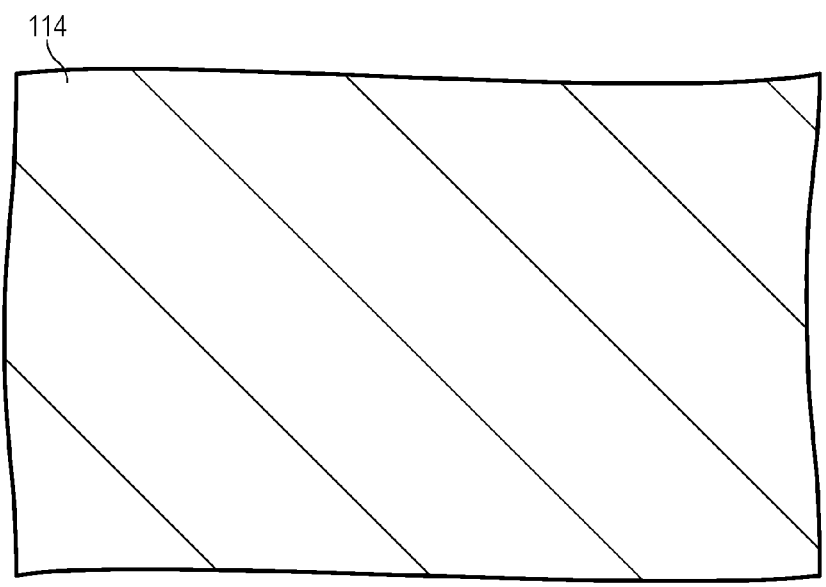
FIGS. 3A-3N are bottom views that correspond to FIGS. 1A-1N, respectively.

FIGS. 1A, 2A and 3A are cross-sectional, top and bottom views, respectively, of carrier 110 which is a copper frame that includes opposing major upper and lower surfaces 112 and 114. Carrier 110 has a thickness (between surfaces 112 and 114) of 125 microns.

Upper surface 112 faces in the upward direction, lower surface 114 faces in the downward direction, and surfaces 112 and 114 extend laterally in the horizontal direction orthogonal to the upward and downward directions. Thus, the height (thickness) extends in the upward and downward (vertical) directions, and the length and width extend in lateral (horizontal) directions that are orthogonal to the upward and downward directions and to one another. Likewise, the height extends upward and downward in the cross-sectional views, the length extends laterally from left-to-right in the cross-sectional, top and bottom views, and the width extends laterally from top-to-bottom in the top and bottom views.

Figure 1B:
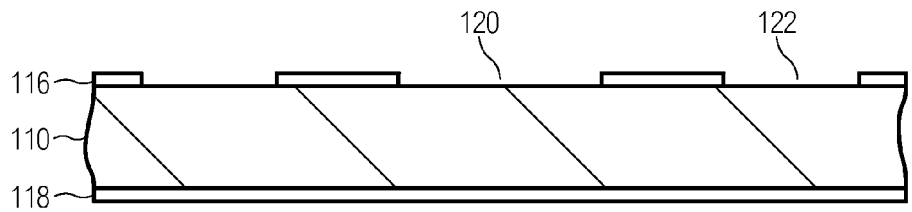
Figure 2B:
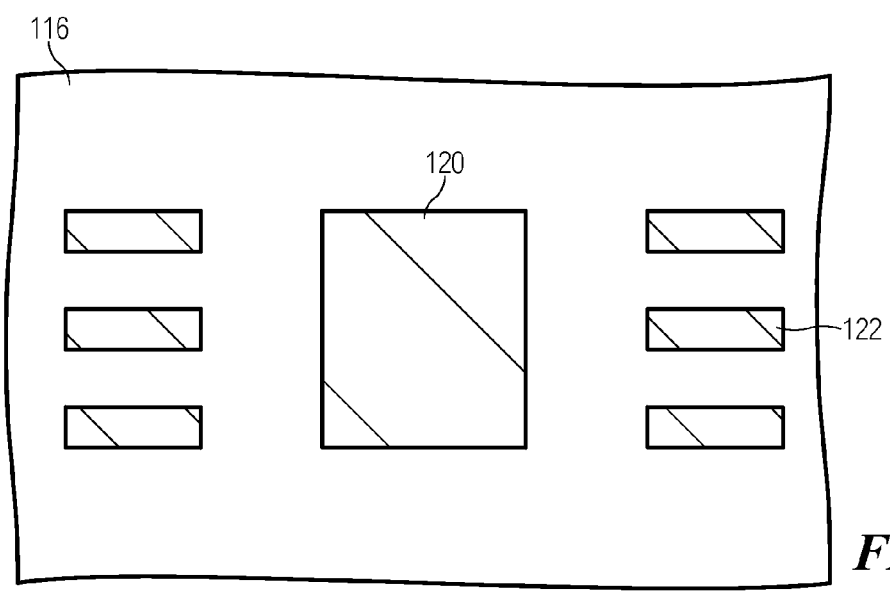
Figure 3B:

FIGS. 1B, 2B and 3B are cross-sectional, top and bottom views, respectively, of photoresist layers 116 and 118 formed on carrier 110. Photoresist layers 116 and 118 are deposited on surfaces 112 and 114, respectively. Thereafter, photoresist layer 116 is patterned using a reticle to contain post slot opening 120 and terminal slot opening 122 that selectively expose separate spaced portions of upper surface 112, and photoresist layer 118 remains unpatterned and covers lower surface 114.

Photoresist layers 116 and 118 have a thickness of 10 microns, post slot opening 120 has a length and width of 600×800 microns, terminal slot opening 122 has a length and width of 400×200 microns, and post slot opening 120 and terminal slot opening 122 are laterally spaced from one another by 250 microns.

Figure 1C:
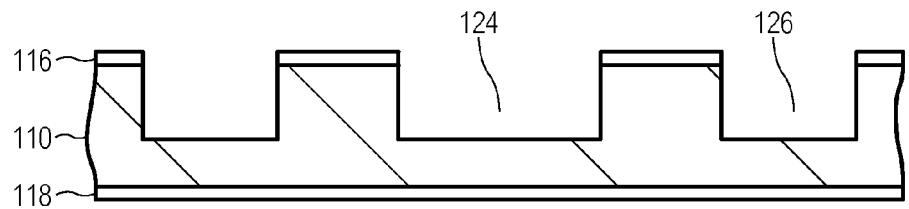
Figure 2C:
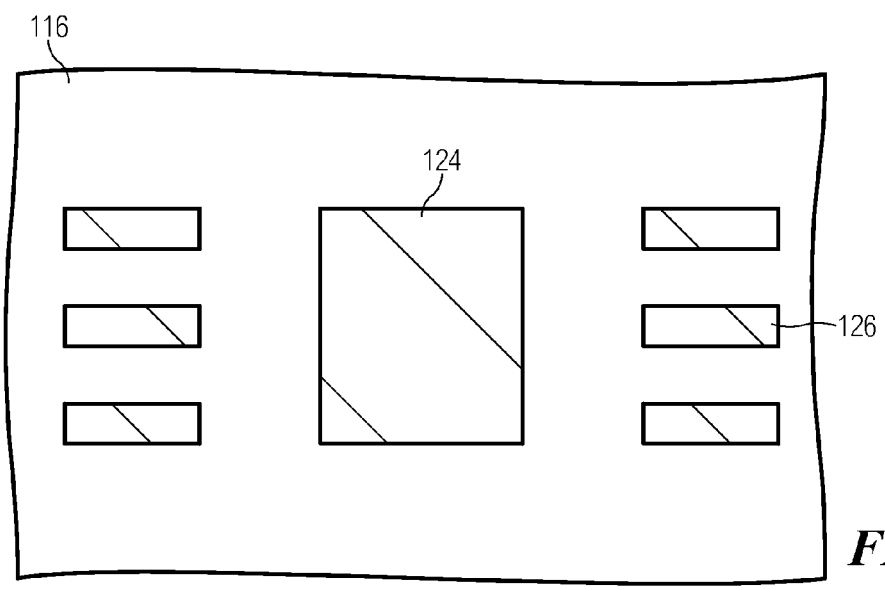
Figure 3C:
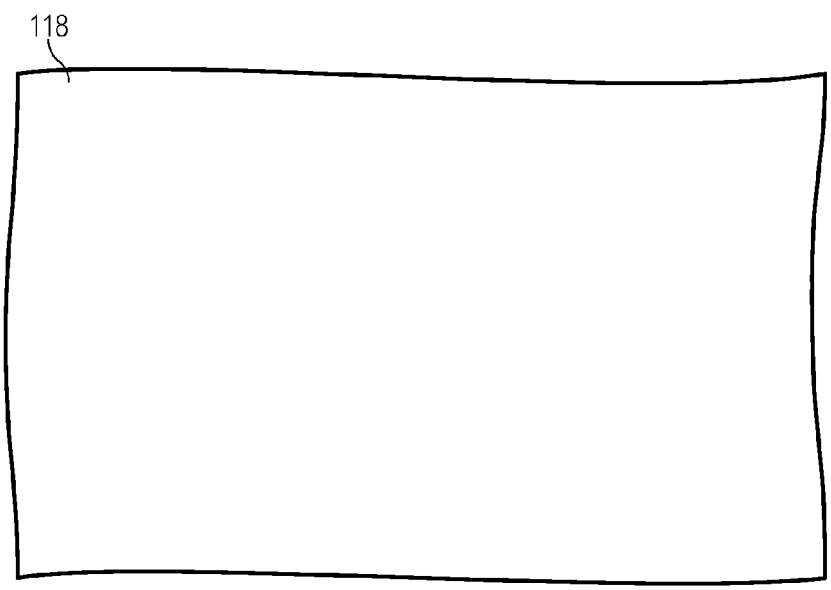

FIGS. 1C, 2C and 3C are cross-sectional, top and bottom views, respectively, of post slot 124 and terminal slot 126 formed in carrier 110. Post slot 124 and terminal slot 126 are formed by applying a front-side wet chemical etch to the exposed portions of upper surface 112 through openings 120 and 122 respectively using photoresist layer 116 as an etch mask and photoresist layer 118 as a back-side protection mask. A spray nozzle (not shown) sprays the wet chemical etch on photoresist layer 116 and into openings 120 and 122. The wet chemical etch is highly selective of copper and etches 75 microns into carrier 110. As a result, post slot 124 and terminal slot 126 extend from upper surface 112 into but not through carrier 110.

Post slot 124 has a length and width of 600×800 microns and a depth of 75 microns, terminal slot 126 has a length and width of 400×200 microns and a depth of 75 microns, and post slot 124 and terminal slot 126 are vertically spaced from lower surface 114 by 50 microns and laterally spaced from one another by 250 microns.

Figure 1D:
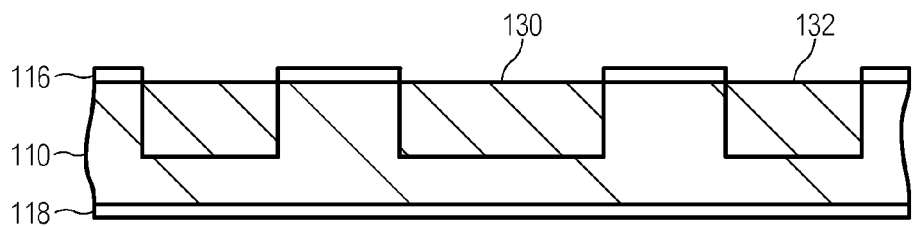
Figure 2D:
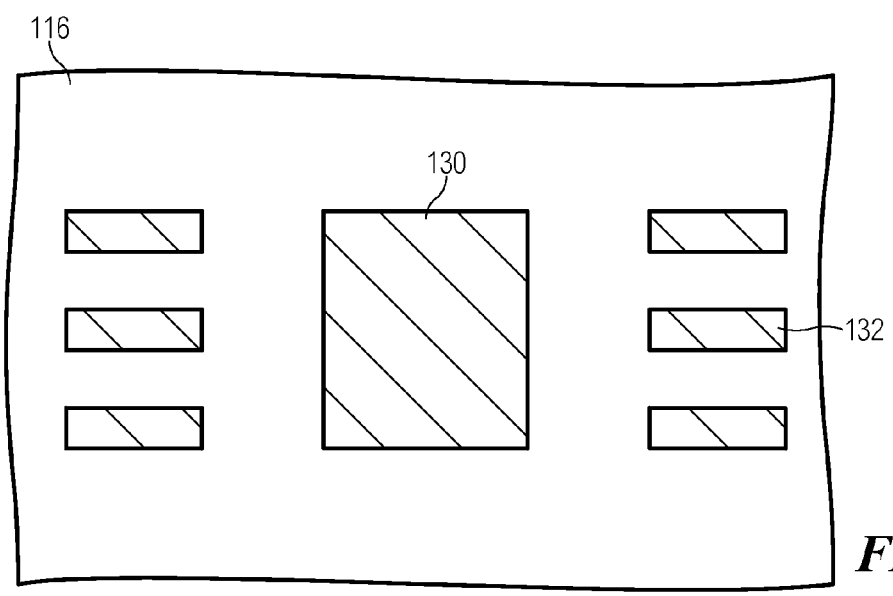
Figure 3D:

FIGS. 1D, 2D and 3D are cross-sectional, top and bottom views, respectively, of post 130 formed in post slot 124 and terminal 132 formed in terminal slot 126.

Post 130 and terminal 132 are composed of a nickel layer electroplated on carrier 110 and a silver layer electroplated on the nickel layer. The nickel layer contacts and is sandwiched between carrier 110 and the silver layer, the silver layer contacts the nickel layer and is spaced from carrier 110. Thus, the nickel layer is buried beneath the silver layer, and the silver layer is exposed. Post 130 and terminal 132 have a thickness of 75 microns. In particular, the nickel layer has a thickness of 70 microns and the silver layer has a thickness of 5 microns. For convenience of illustration, the nickel and silver layers are shown as a single layer.

Post 130 and terminal 132 are simultaneously formed by an electroplating operation using photoresist layer 116 as a plating mask and photoresist layer 118 as a back-side protection mask. Thus, post slot opening 120 exposes post slot 124 and terminal slot opening 122 exposed terminal slot 126. A plating bus (not shown) is connected to carrier 110, current is applied to the plating bus from an external power source, and carrier 110 is submerged in an electrolytic nickel plating solution. As a result, the nickel layer electroplates on carrier 110 in post slot 124 and terminal slot 126. The nickel electroplating operation continues until the nickel layer has the desired thickness. Thereafter, the structure is removed from the electrolytic nickel plating solution and submerged in an electrolytic silver plating solution while current is applied to the plating bus to electroplate the silver layer on the nickel layer. The silver electroplating operation continues until the silver layer has the desired thickness. Thereafter, the structure is removed from the electrolytic silver plating solution and rinsed in distilled water.

Post 130 has a length and width of 600×800 microns and a depth of 75 microns, terminal 132 has a length and width of 400×200 microns and a depth of 75 microns, and post 130 and terminal 132 are vertically spaced from lower surface 114 by 50 microns and laterally spaced from one another by 250 microns.

Post 130 fills and is located within post slot 124, terminal 132 fills and is located within terminal slot 126, and post 130 and terminal 132 are coplanar with upper surface 112 and with one another.

Figure 1E:
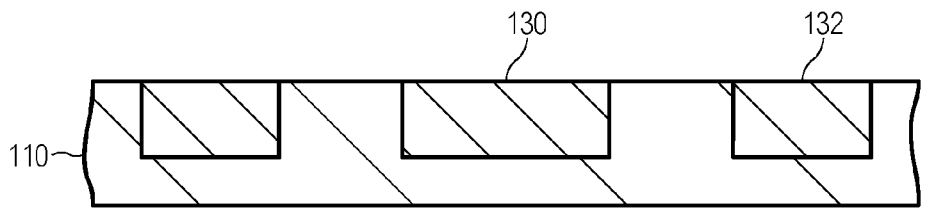
Figure 2E:
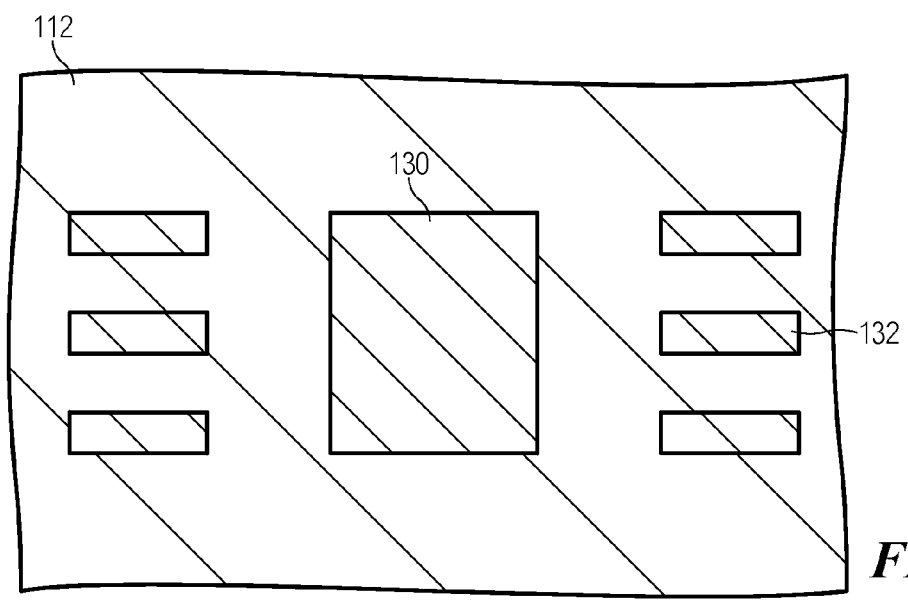
Figure 3E:
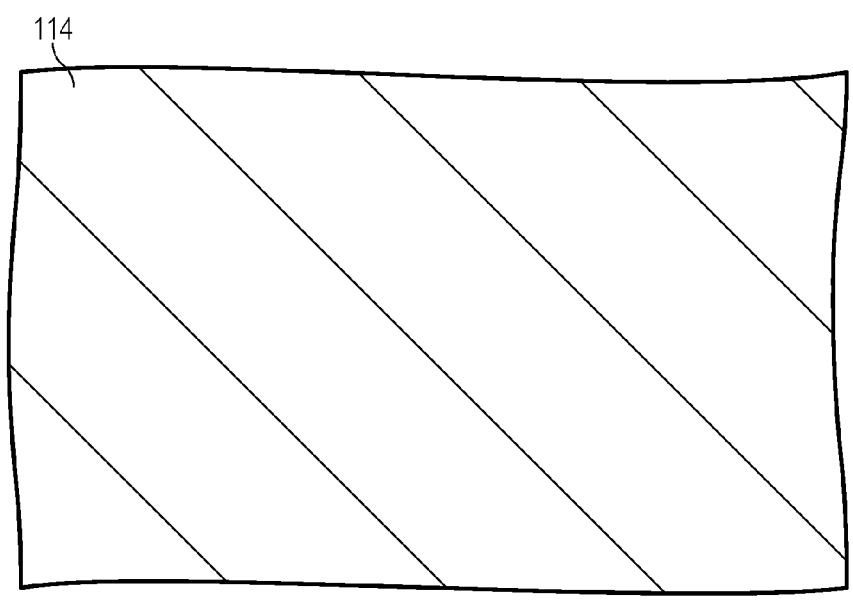

FIGS. 1E, 2E and 3E are cross-sectional, top and bottom views, respectively, of carrier 110, post 130 and terminal 132 after photoresist layers 116 and 118 are removed from carrier 110.

Figure 1F:
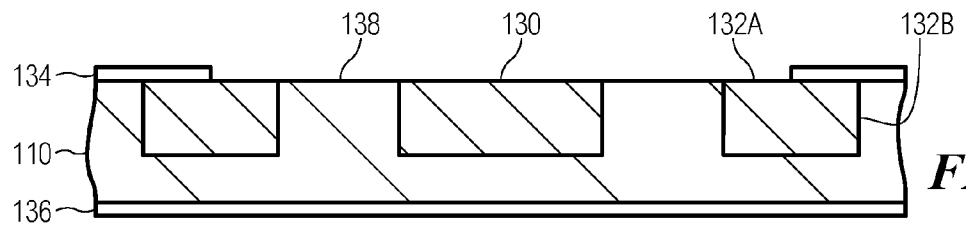
Figure 2F:
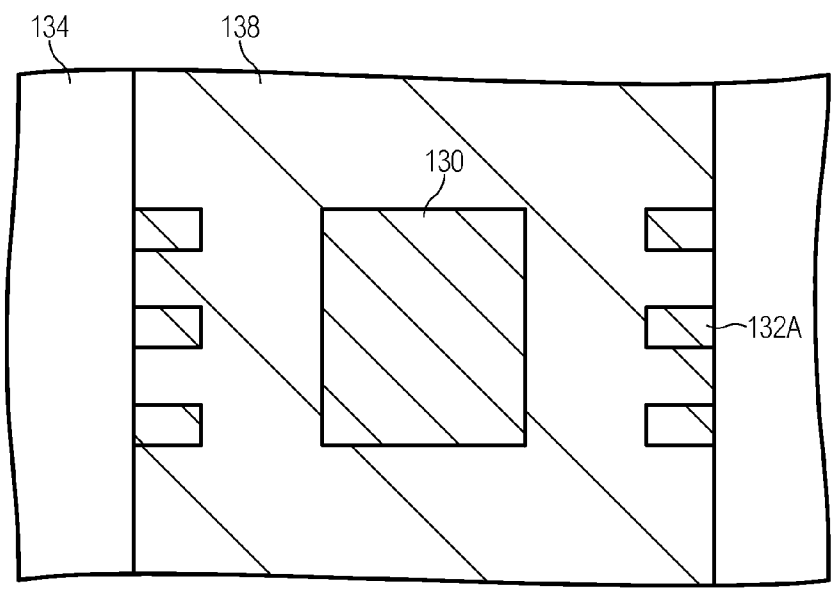
Figure 3F:
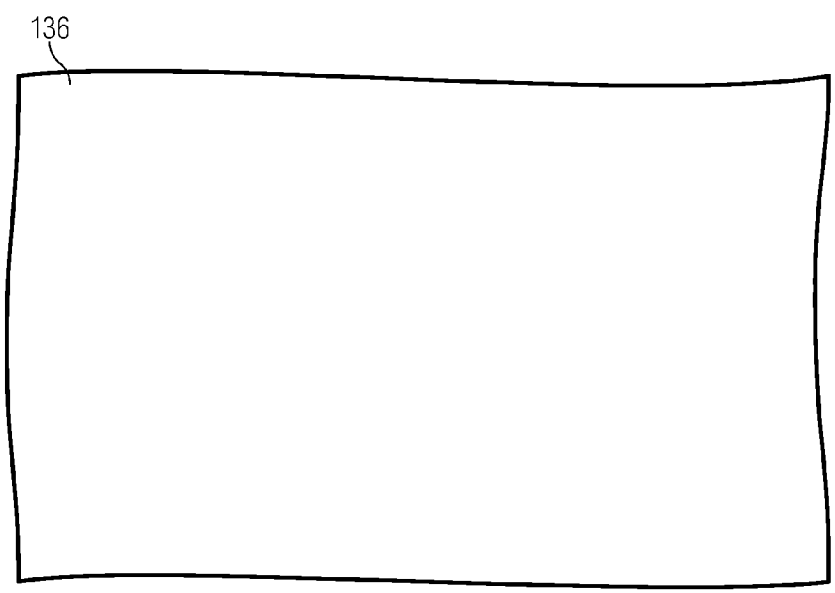

FIGS. 1F, 2F and 3F are cross-sectional, top and bottom views, respectively, of photoresist layers 134 and 136 formed on carrier 110. Photoresist layers 134 and 136 are deposited on surfaces 112 and 114, respectively. Thereafter, photoresist layer 134 is patterned using a reticle to contain encapsulant slot opening 138 that selectively exposes upper surface 112, post 130 and terminal portion 132A of terminal 132 and covers terminal portion 132B of terminal 132, and photoresist layer 136 remains unpatterned and covers lower surface 114.

Photoresist layers 134 and 136 have a thickness of 10 microns, and encapsulant slot opening 138 has a length and width of 1500×1200 microns.

Figure 1G:
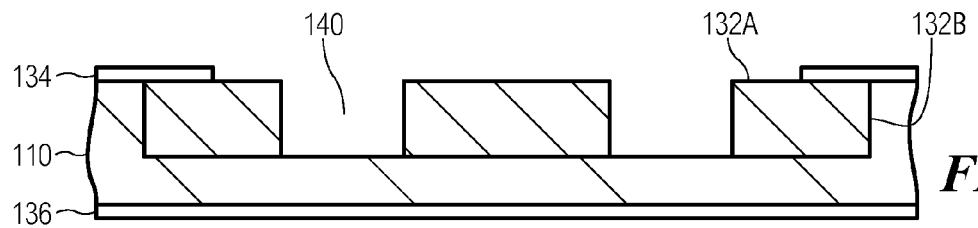
Figure 2G:
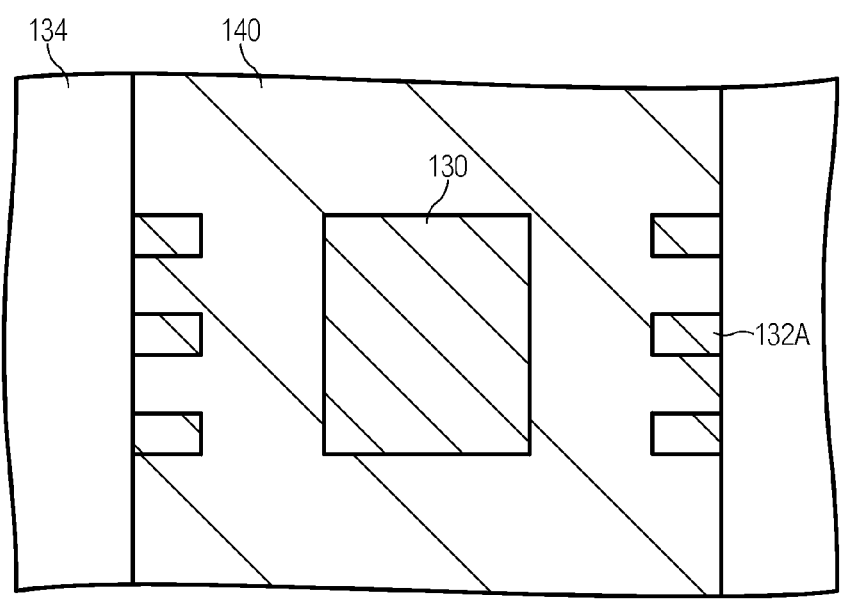
Figure 3G:

FIGS. 1G, 2G and 3G are cross-sectional, top and bottom views, respectively, of encapsulant slot 140 formed in carrier 110. Encapsulant slot 140 is formed by applying a front-side wet chemical etch to the exposed portions of upper surface 112, post 130 and terminal 132 through encapsulant slot opening 138 using photoresist layer 134 as an etch mask and photoresist layer 136 as a back-side protection mask. A spray nozzle (not shown) sprays the wet chemical etch on photoresist layer 134 and into encapsulant slot opening 138. The wet chemical etch is highly selective of copper with respect to nickel and silver and etches 75 microns into carrier 110 without appreciably affecting post 130 and terminal 132. As a result, encapsulant slot 140 extends from upper surface 112 into but not through carrier 110.

Encapsulant slot 140 has a length and width of 1500×1200 microns and a depth of 75 microns. Thus, encapsulant slot 140 has a rectangular periphery of 1500×1200 microns that defines a lateral surface area of 1,800,000 square microns. Post 130 is centrally located within encapsulant slot 140, its upper and side surfaces are exposed and its lower surface continues to contact carrier 110. Terminal 132 extends into and outside encapsulant slot 140. In particular, terminal portion 132A is located within encapsulant slot 140, its upper and side surfaces are exposed and its lower surface continues to contact carrier 110, and terminal portion 132B is located outside encapsulant slot 140 and is unexposed. Terminal portions 132A and 132B have a length and width of 200×200 microns, are contiguous and integral with one another and are adjacent to one another at the periphery of encapsulant slot 140.

Figure 1H:
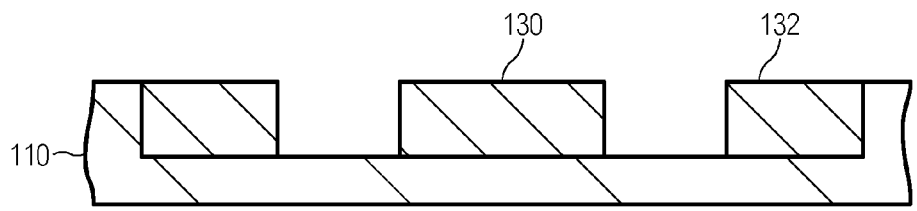
Figure 2H:
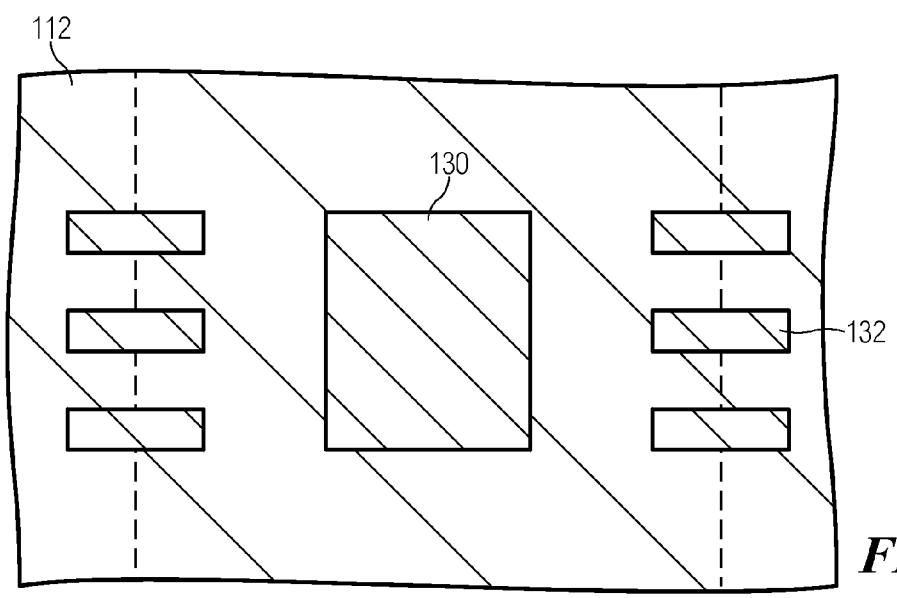
Figure 3H:
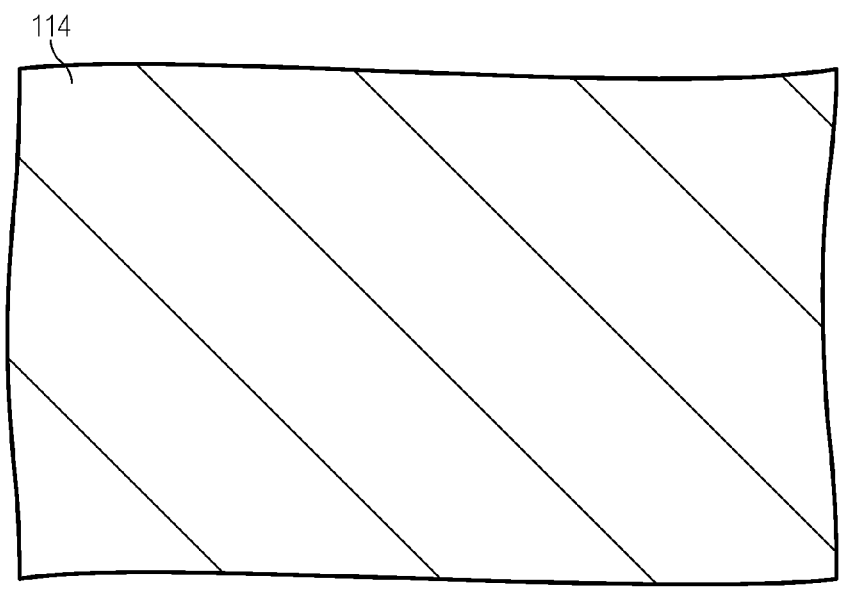

FIGS. 1H, 2H and 3H are cross-sectional, top and bottom views, respectively, of carrier 110, post 130 and terminal 132 after photoresist layers 134 and 136 are removed from carrier 110. Encapsulant slot 140 is depicted in broken lines in the top view.

Figure 1I:
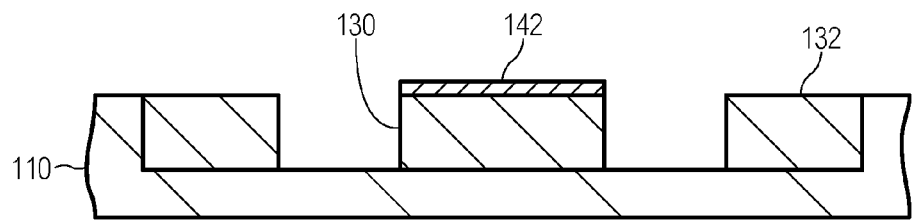
Figure 2I:
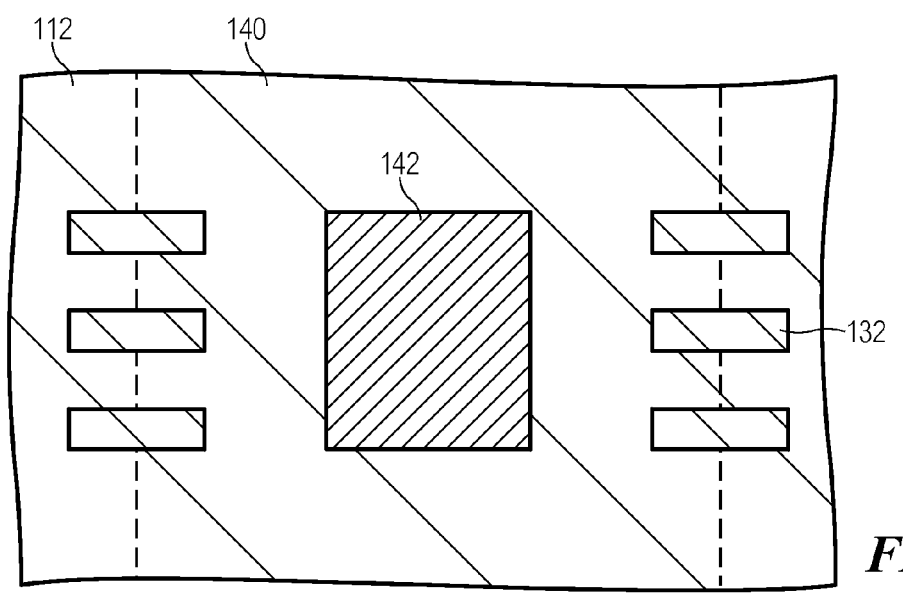
Figure 3I:
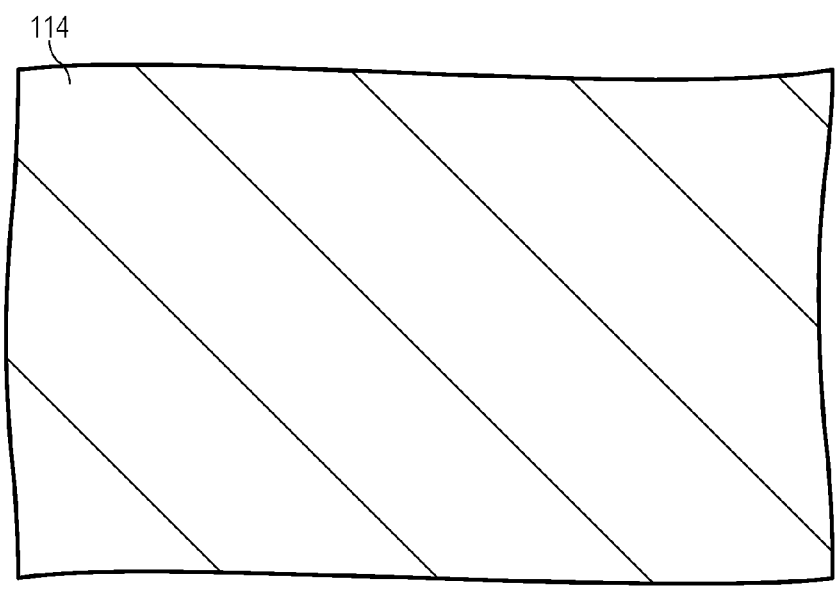

FIGS. 1I, 2I and 3I are cross-sectional, top and bottom views, respectively, of adhesive 142 formed on post 130.

Adhesive 142 is deposited as uncured epoxy (A stage) on post 130 using stencil printing. During stencil printing, a stencil (not shown) is placed on carrier 110, a stencil opening is aligned with post 130, and then a squeegee (not shown) pushes the uncured epoxy along the surface of the stencil opposite carrier 110, through the stencil opening and on post 130 but not into encapsulant slot 140. The uncured epoxy is compliant enough at room temperature to conform to virtually any shape.

Figure 1J:
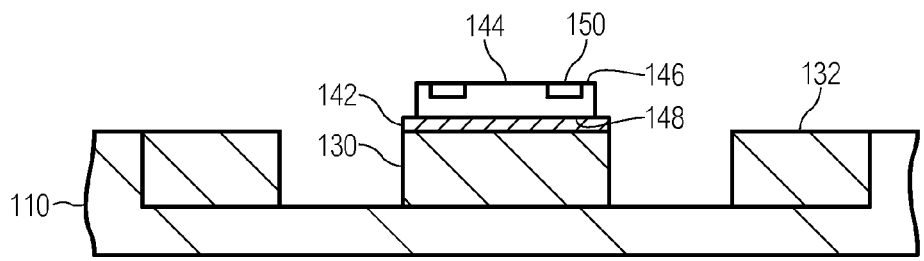
Figure 2J:
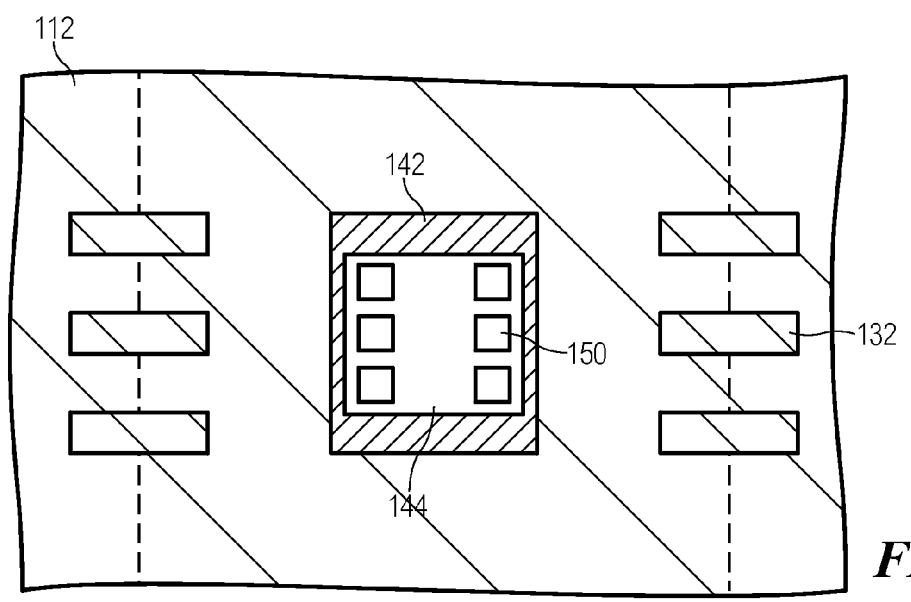
Figure 3J:
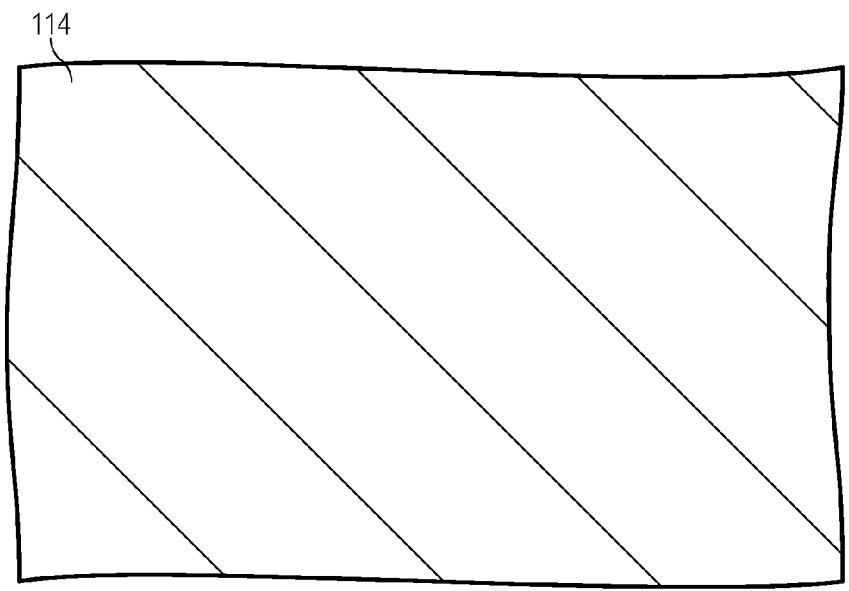

FIGS. 1J, 2J and 3J are cross-sectional, top and bottom views, respectively, of semiconductor chip 144 mechanically attached to post 130 by adhesive 142.

Chip 144 is placed on adhesive 142 (which is still uncured epoxy) using a pick-up head (not shown) that applies low pressure, briefly holds chip 144 against adhesive 142 and then releases chip 144. Thus, adhesive 142 loosely mechanically attaches chip 144 to post 130. Thereafter, adhesive 142 is heated to a relatively low but higher temperature such as 250° C. to convert the uncured epoxy into cured epoxy (C stage) that rigidly mechanically attaches chip 144 to post 130.

Adhesive 142 is a die attach epoxy that contacts and is sandwiched between and mechanically attaches chip 144 to post 130. Adhesive 142 has a thickness of 10 microns (between post 130 and chip 144).

Chip 144 is an integrated circuit that includes opposing major upper and lower surfaces 146 and 148. Upper surface 146 faces in the upward direction, and lower surface 148 faces in the downward direction. Chip 144 also includes chip pad 150 at upper surface 146 that transfers an electrical signal between chip 144 and external circuitry during operation of chip 144. Chip 144 has a length and width of 500×500 microns and a thickness (between surfaces 146 and 148) of 75 microns, and chip pad 150 has a length and width of 50×50 microns.

Adhesive 142 and chip 144 are located outside encapsulant slot 140 (since they are located above encapsulant slot 140) but within the periphery of encapsulant slot 140 (since they are located within the lateral surface area of encapsulant slot 140). Likewise, adhesive 142 is located above post 130, and chip 144 is located above and within the lateral surface area of post 130.

Figure 1K:
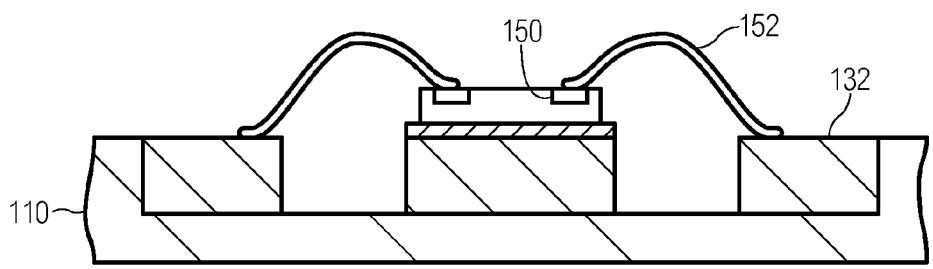
Figure 2K:
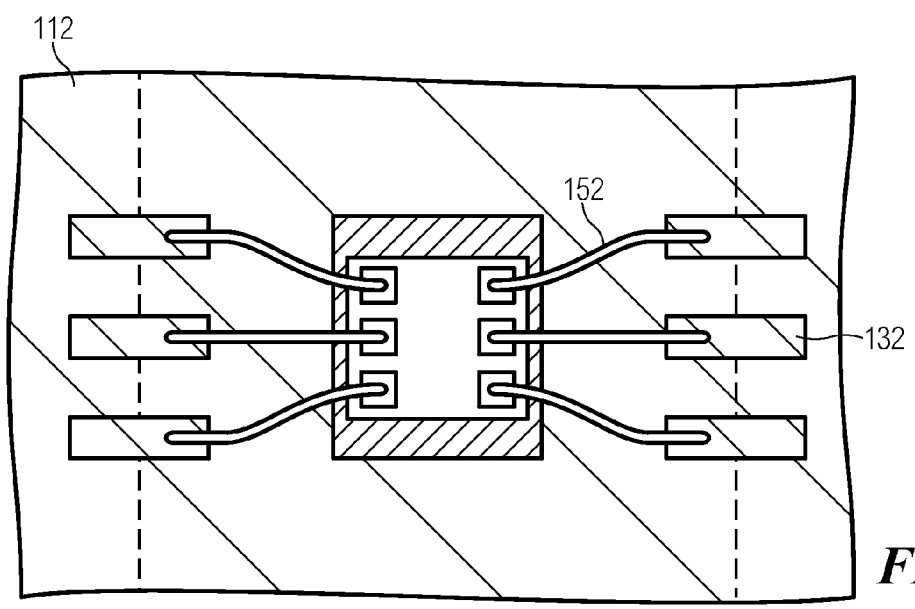
Figure 3K:
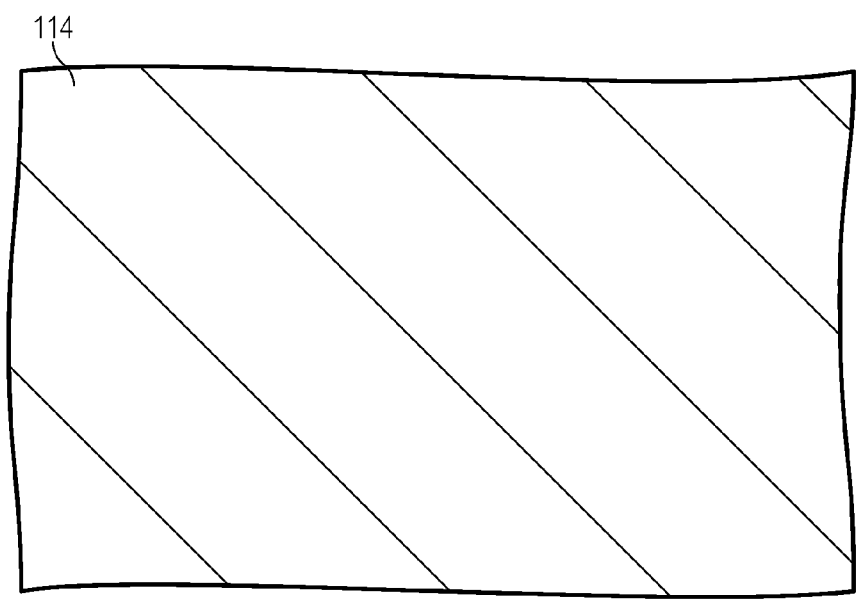

FIGS. 1K, 2K and 3K are cross-sectional, top and bottom views, respectively, of wire bond 152 formed on terminal 132 and chip pad 150.

Wire bond 152 is a gold wire that is ball bonded to chip pad 150 and then wedge bonded to terminal 132. The gold wire between the ball bond and the wedge bond has a diameter of 25 microns. Thus, wire bond 152 contacts and electrically connects terminal 132 and chip pad 150.

Figure 1L:
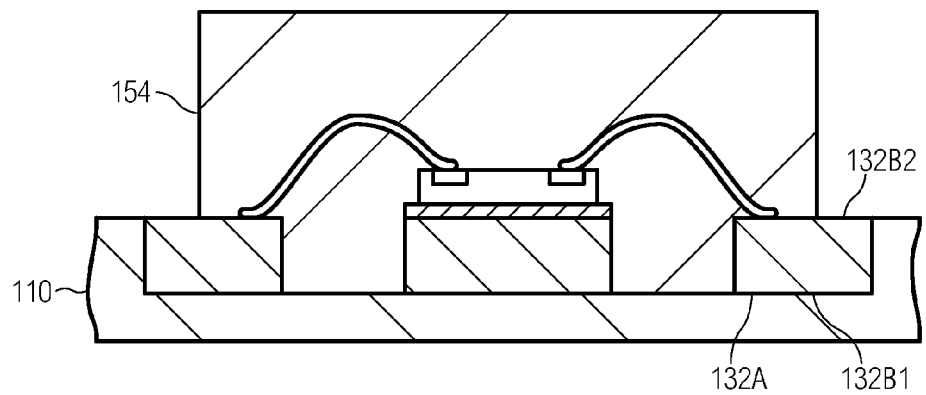
Figure 2L:
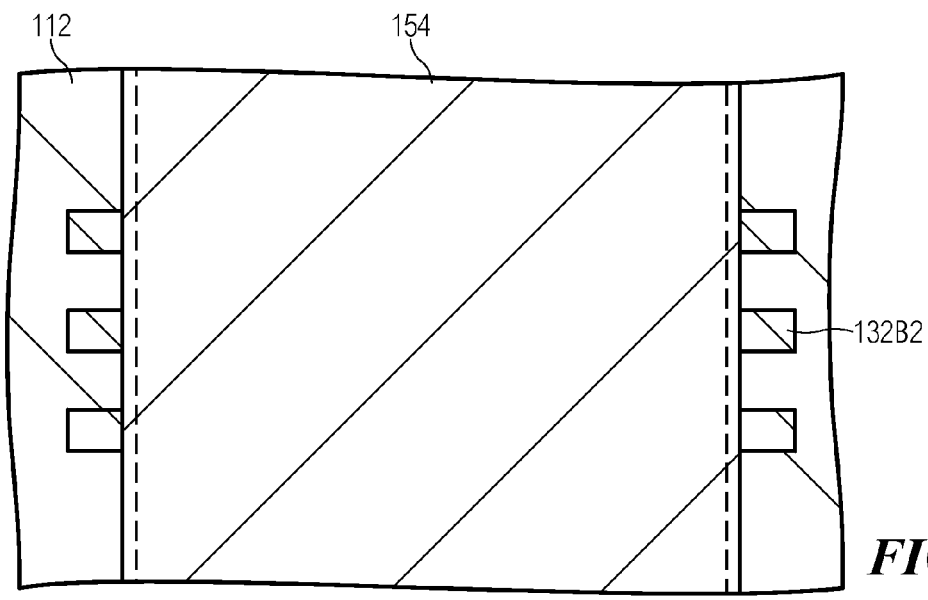
Figure 3L:
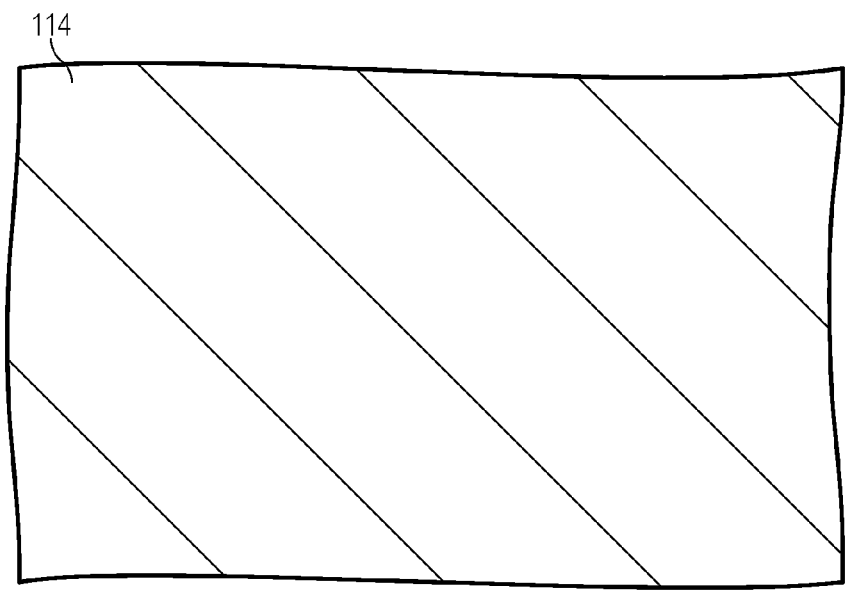

FIGS. 1L, 2L and 3L are cross-sectional, top and bottom views, respectively, of encapsulant 154 formed on carrier 110, post 130, terminal 132, adhesive 142, chip 144 and wire bond 152.

Encapsulant 154 is deposited by transfer molding. Generally speaking, transfer molding involves forming components in a closed mold tool from a mold compound that is conveyed under pressure in a hot, plastic state from a central reservoir called the transfer pot through a tree-like array of runners and gates into closed cavities.

Encapsulant 154 contacts and extends above carrier 110, post 130, terminal 132, adhesive 142, chip 144 and wire bond 152, is located within the periphery of carrier 110, covers post 130, adhesive 142, chip 144 and wire bond 152 and fills the remaining space in encapsulant slot 140. Thus, encapsulant 154 extends into but not through carrier 110, contacts upper surface 112 and is spaced from lower surface 114. Furthermore, post 130, terminal 132 and encapsulant 154 fill encapsulant slot 140.

Encapsulant 154 laterally extends 50 microns past encapsulant slot 140 at upper surface 112 along terminal 132. As a result, terminal portion 132A extends into encapsulant 154 in encapsulant slot 140, is located within the periphery of encapsulant 154 in encapsulant slot 140 and is embedded in encapsulant 154 in encapsulant slot 140, and terminal portion 132B is located outside the periphery of encapsulant 154 in encapsulant slot 140, extends within and outside the periphery of encapsulant 154 and is not embedded in encapsulant 154.

In particular, terminal portion 132A extends into encapsulant 154, its upper and side surfaces contact encapsulant 154 and its lower surface continues to contact carrier 110, terminal portion 132B1 extends within the periphery of encapsulant 154 outside encapsulant slot 140, its upper surface contacts encapsulant 154 and its side and lower surfaces continue to contact carrier 110, and terminal portion 132B2 is located outside the periphery of encapsulant 154, its upper and side surfaces continue to be exposed and its lower surface continues to contact carrier 110. Terminal portion 132B1 has a length and width of 50×200 microns, terminal portion 132B2 has a length and width of 150×200 microns, terminal portions 132A and 132B1 are contiguous and integral with one another and are adjacent to one another at the periphery of encapsulant slot 140, and terminal portions 132B1 and 132B2 are contiguous and integral with one another and are adjacent to one another at the periphery of encapsulant 154.

Encapsulant 154 is an electrically insulative epoxy mold compound that has a length of 1600 microns and a thickness (between its upper surface and its lower surface adjacent to upper surface 112) of 500 microns.

Figure 1M:
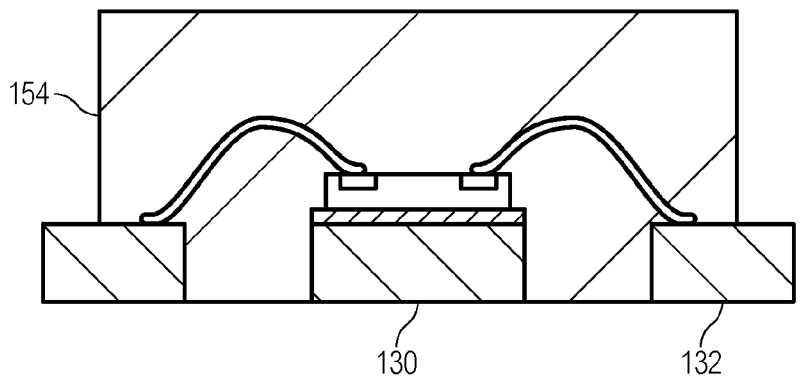
Figure 2M:
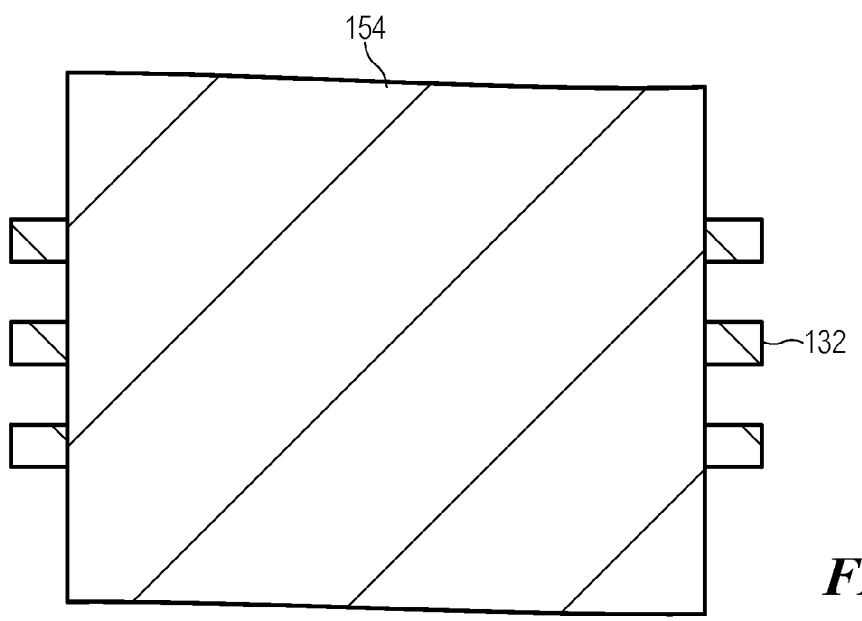
Figure 3M:
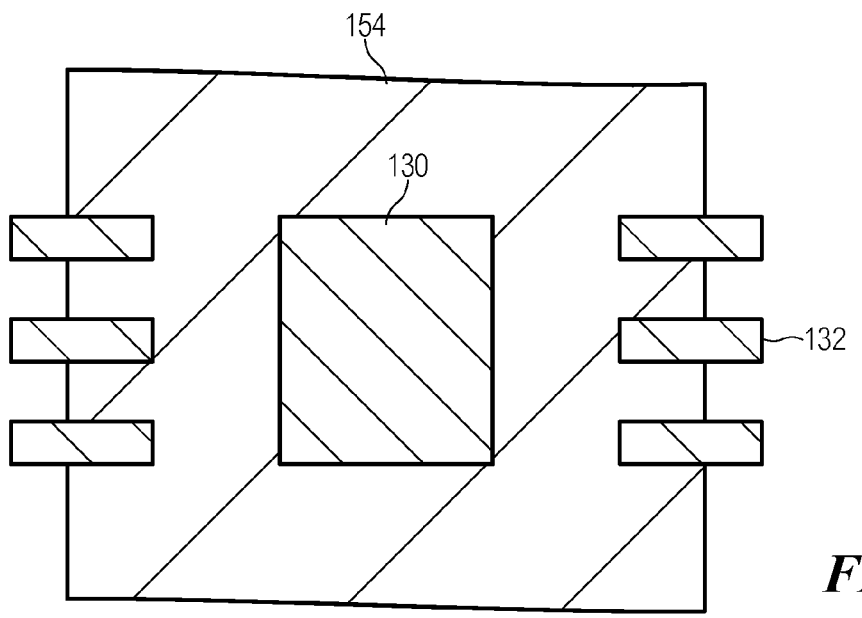

FIGS. 1M, 2M and 3M are cross-sectional, top and bottom views, respectively, of post 130, terminal 132, adhesive 142, chip 144, wire bond 152 and encapsulant 154 after carrier 110 is removed from post 130, terminal 132 and encapsulant 154.

Carrier 110 is removed by applying a blanket back-side wet chemical etch to carrier 110, post 130, terminal 132 and encapsulant 154. A spray nozzle (not shown) sprays the wet chemical etch on lower surface 114 using encapsulant 154 as a front-side protection mask. The wet chemical etch is highly selective of copper with respect to nickel and the mold compound. Therefore, adhesive 142, chip 144 and wire bond 152 are not exposed to the wet chemical etch. The wet chemical etch removes carrier 110 without appreciably affecting post 130, terminal 132, adhesive 142, chip 144 and wire bond 152. As a result, the wet chemical etch exposes the lower surfaces of post 130, terminal 132 and encapsulant 154 in the downward direction.

Encapsulant 154 is shown extending above post 130, terminal 132, adhesive 142, chip 144 and wire bond 152 to retain a single orientation throughout the drawings, although in this step the structure is inverted so that gravitational force assists the wet chemical etch.

Figure 1N:
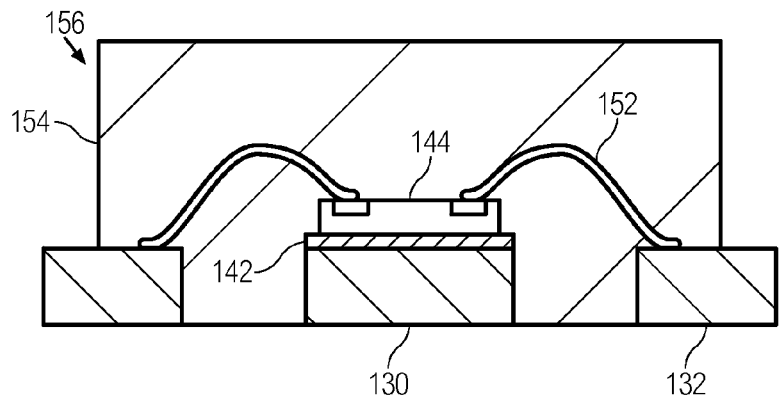
Figure 2N:
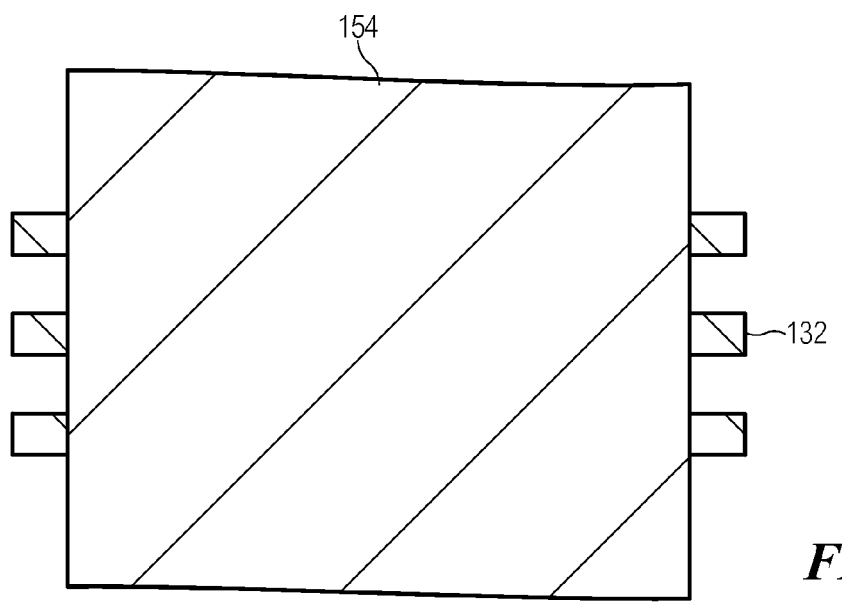
Figure 3N:
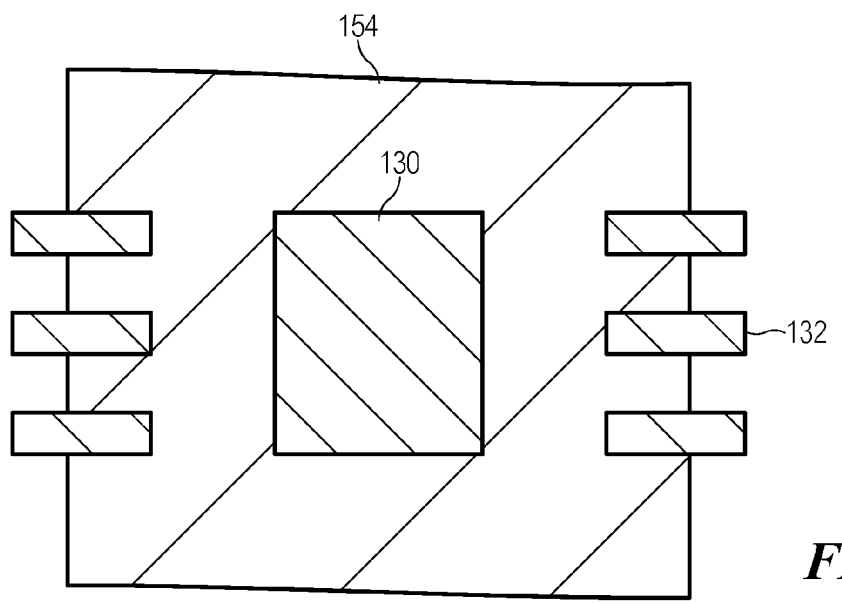

FIGS. 1N, 2N and 3N are cross-sectional, top and bottom views, respectively, of semiconductor package 156 that includes post 130, terminal 132, adhesive 142, chip 144, wire bond 152 and encapsulant 154 after encapsulant 154 is sawed with an excise blade at two opposing sides (that extend lengthwise and are spaced from terminal 132) to singulate semiconductor package 156 from other semiconductor packages.

Semiconductor package 156 is a single-chip first-level leaded package in which terminal 132 (at terminal portion 132B2) laterally protrudes from encapsulant 154 and extends into and is embedded in encapsulant 154 (at terminal portion 132A).

FIGS. 4A-4N, 5A-5N and 6A-6N are cross-sectional, top and bottom views, respectively, of a method of manufacturing a semiconductor package in accordance with a second embodiment of the present invention. In the second embodiment, the semiconductor package is a leadless package. For purposes of brevity, any description in the first embodiment is incorporated in the second embodiment and need not be repeated, and elements of the second embodiment similar to those in the first embodiment have corresponding reference numerals indexed at two-hundred rather than one-hundred. For instance, carrier 210 corresponds to carrier 110, post 230 corresponds to post 130, etc.

Figure 4A:
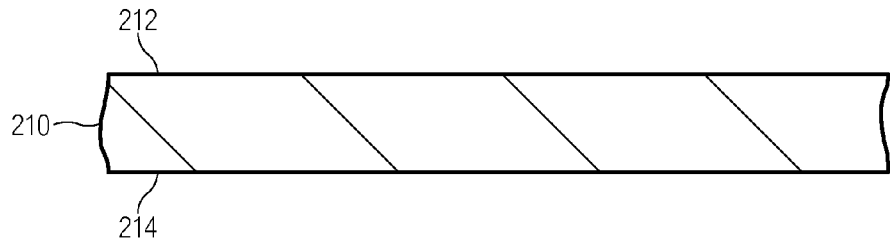
FIGS. 4A-4N are cross-sectional views of a method of manufacturing a semiconductor package in accordance with a second embodiment of the present invention.
Figure 5A:
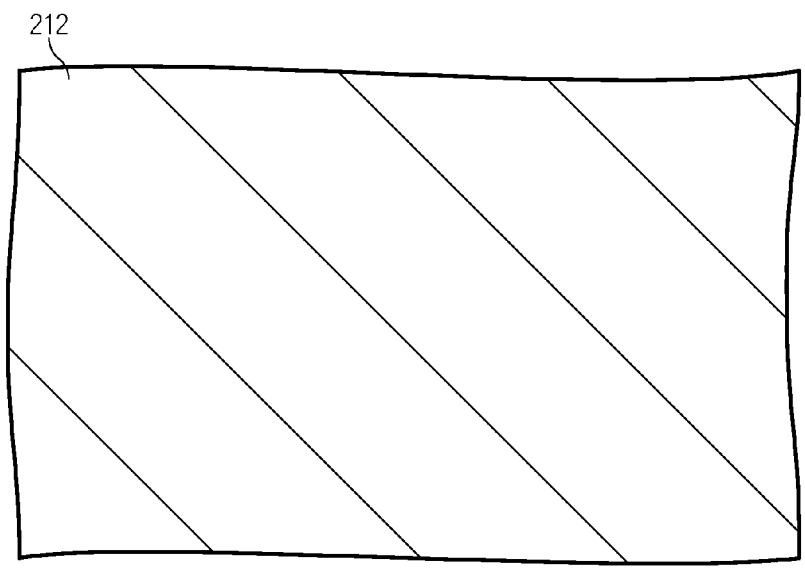
FIGS. 5A-5N are top views that correspond to FIGS. 4A-4N, respectively.
Figure 6A:
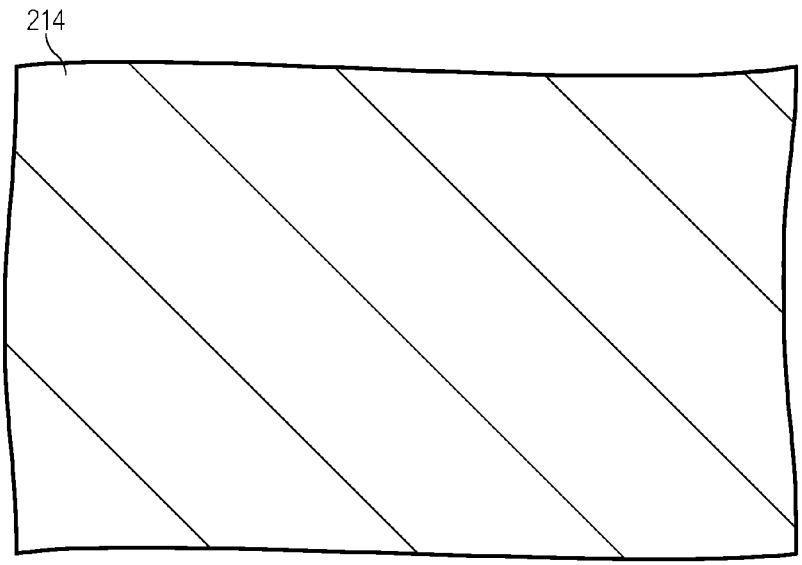
FIGS. 6A-6N are bottom views that correspond to FIGS. 4A-4N, respectively.

FIGS. 4A, 5A and 6A are cross-sectional, top and bottom views, respectively, of carrier 210 that includes opposing major upper and lower surfaces 212 and 214.

Figure 4B:
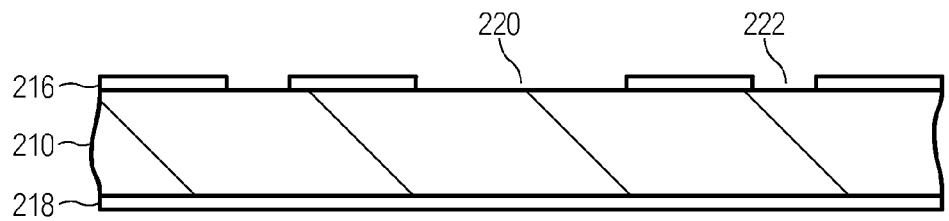
Figure 5B:
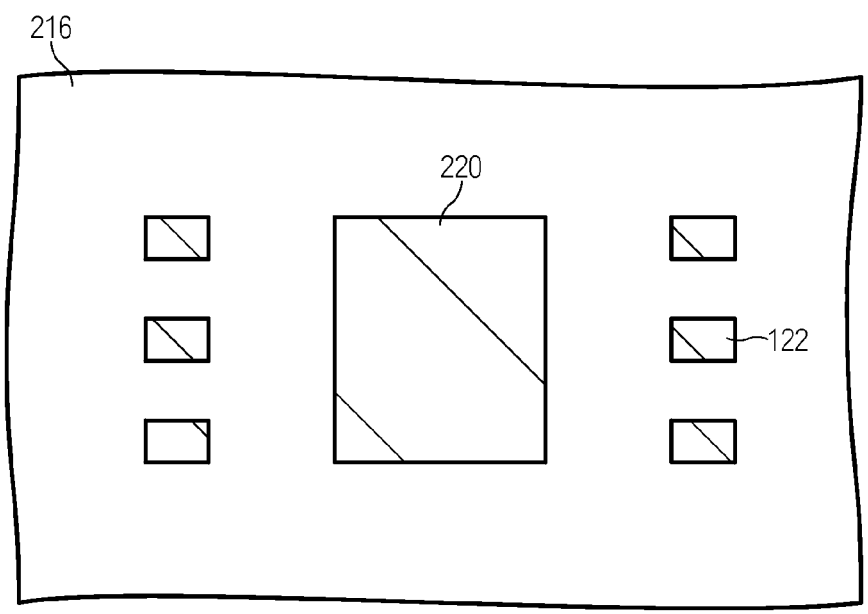
Figure 6B:
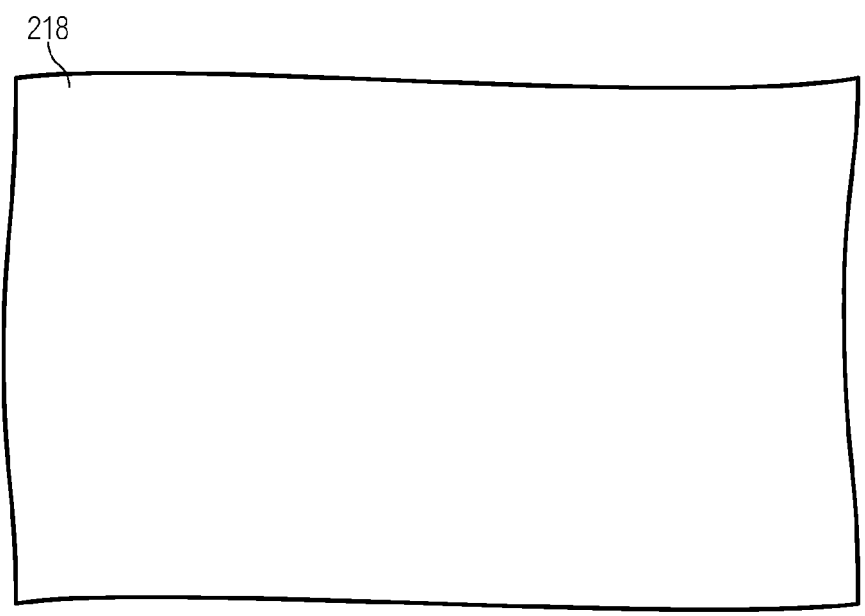

FIGS. 4B, 5B and 6B are cross-sectional, top and bottom views, respectively, of photoresist layers 216 and 218 formed on carrier 210. Photoresist layer 216 contains post slot opening 220 and terminal slot opening 222 that selectively expose upper surface 212 and photoresist layer 218 remains unpatterned. Terminal slot opening 222 has a length of 185 microns (rather than 400 microns).

Figure 4C:
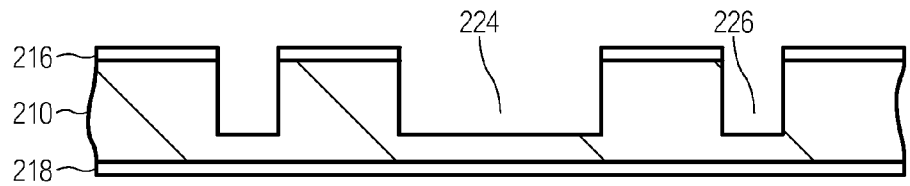
Figure 5C:
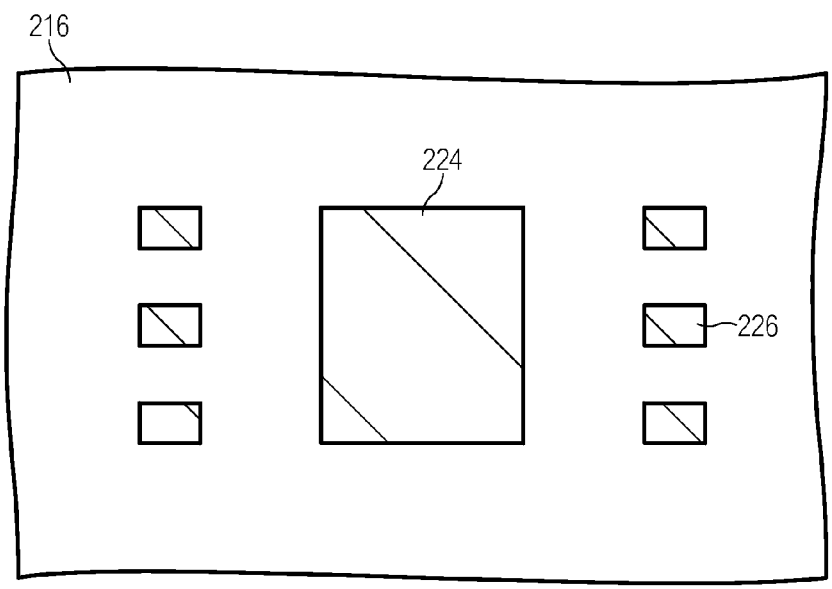
Figure 6C:
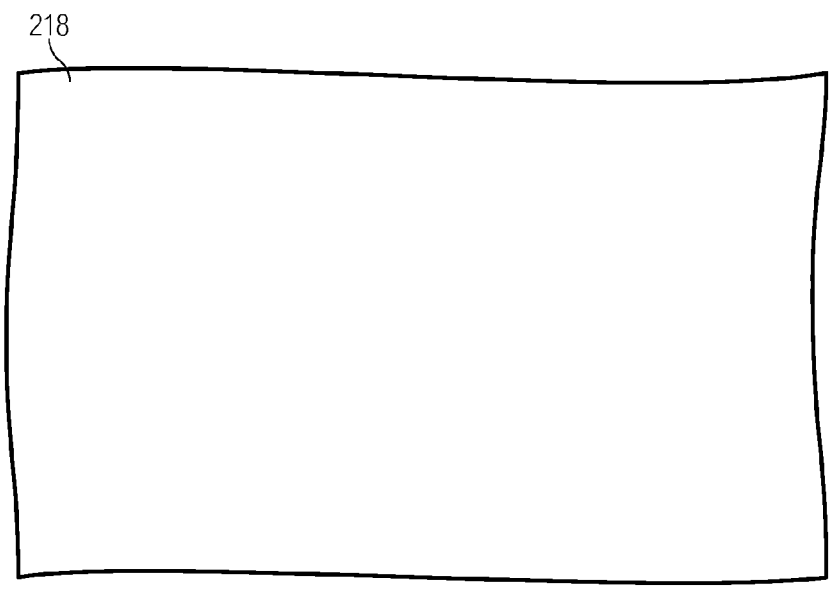

FIGS. 4C, 5C and 6C are cross-sectional, top and bottom views, respectively, of post slot 224 and terminal slot 226 formed in carrier 210 by a wet chemical etch using photoresist layer 216 as an etch mask. Terminal slot 226 has a length of 185 microns (rather than 400 microns).

Figure 4D:
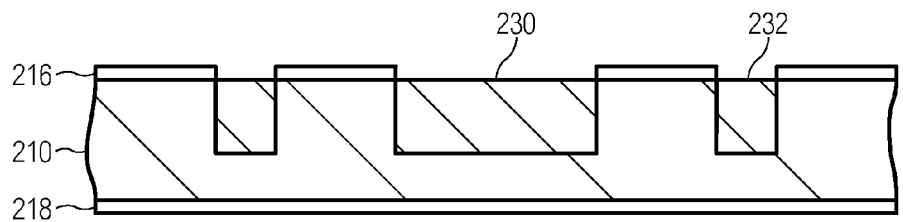
Figure 5D:
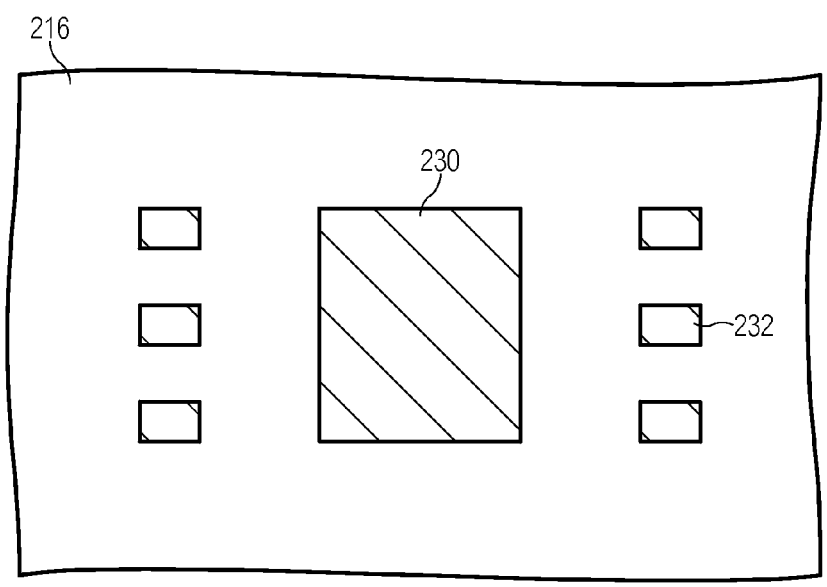
Figure 6D:

FIGS. 4D, 5D and 6D are cross-sectional, top and bottom views, respectively, of post 230 formed in post slot 224 and terminal 232 formed in terminal slot 226 by electroplating. Terminal 232 has a length of 185 microns (rather than 400 microns).

Figure 4E:
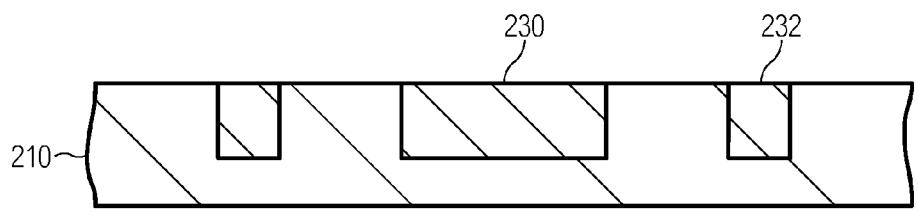
Figure 5E:
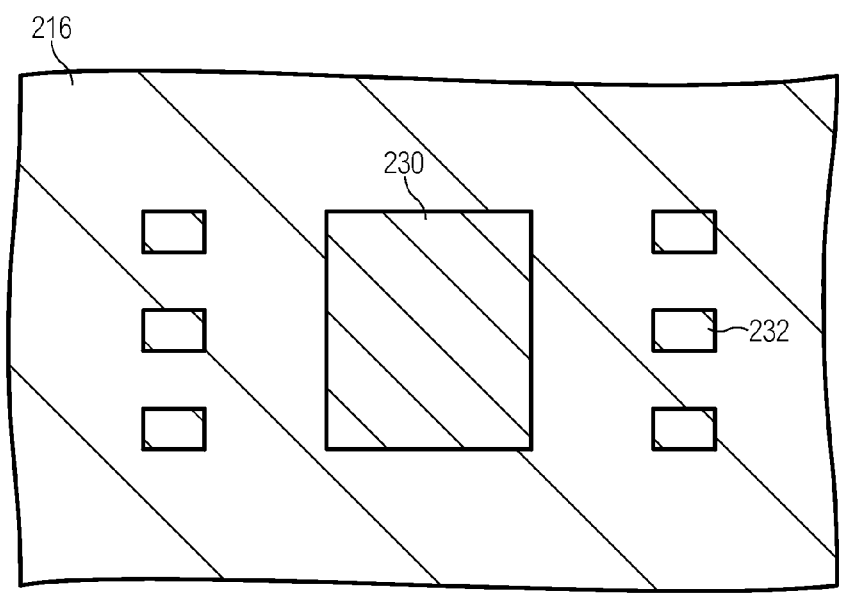
Figure 6E:
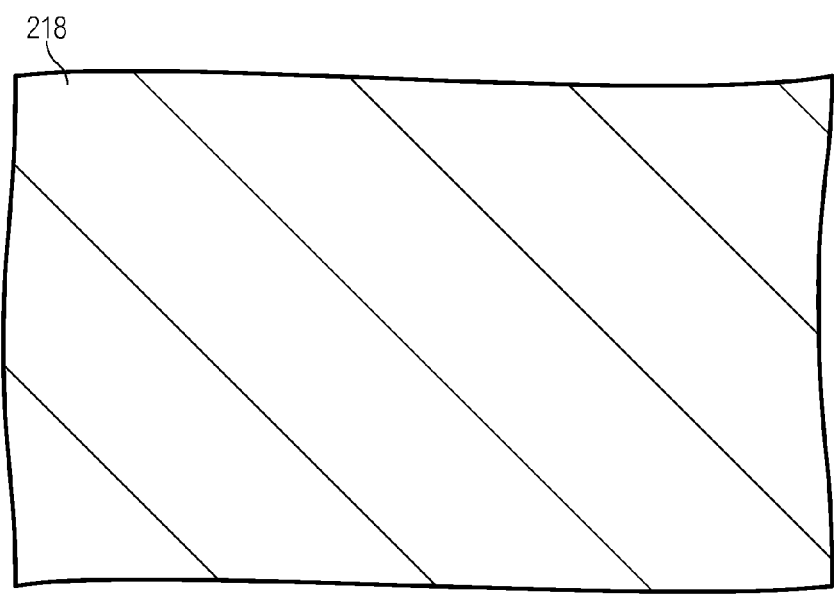

FIGS. 4E, 5E and 6E are cross-sectional, top and bottom views, respectively, of carrier 210, post 230 and terminal 232 after photoresist layers 216 and 218 are removed from carrier 210.

Figure 4F:
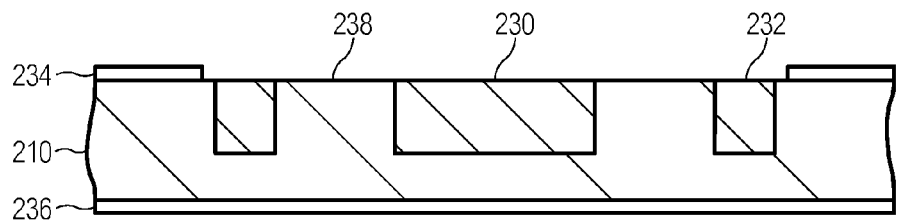
Figure 5F:
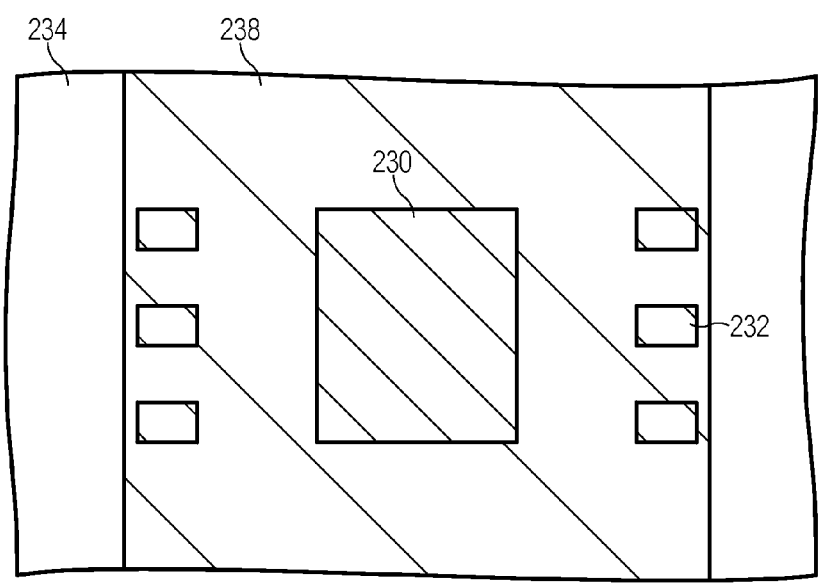
Figure 6F:
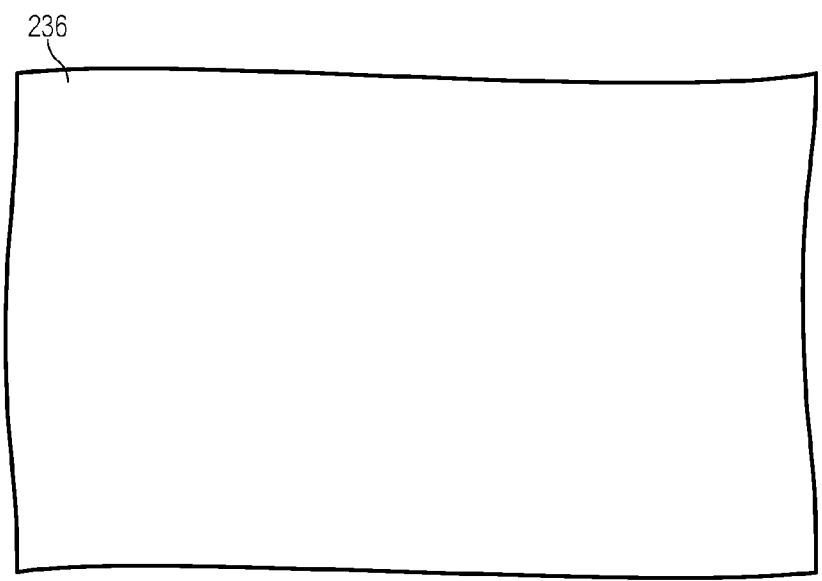

FIGS. 4F, 5F and 6F are cross-sectional, top and bottom views, respectively, of photoresist layers 234 and 236 formed on carrier 210. Photoresist layer 234 contains encapsulant slot opening 238 that selectively exposes upper surface 212, post 230 and terminal 232 and photoresist layer 236 remains unpatterned.

Figure 4G:
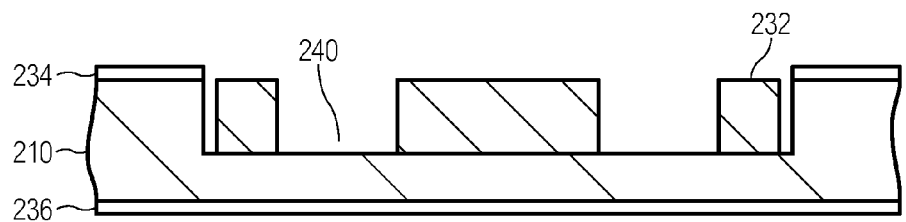
Figure 5G:
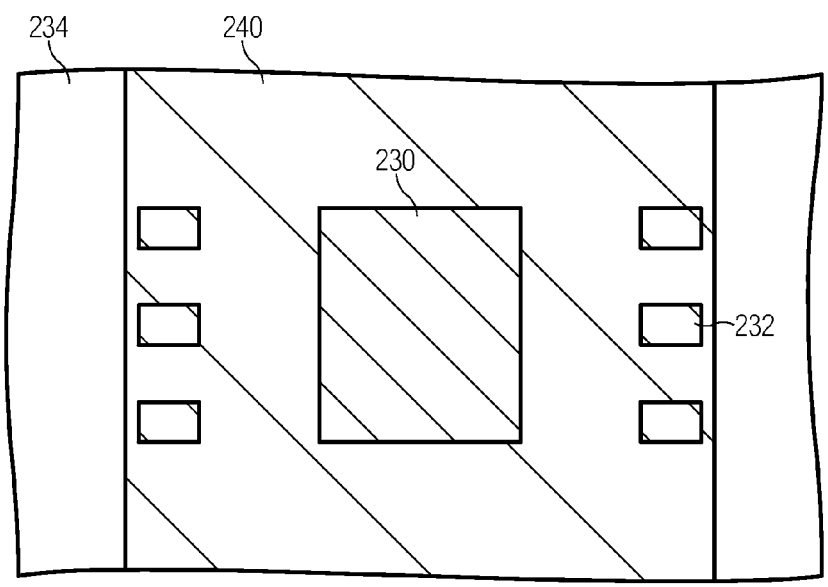
Figure 6G:

FIGS. 4G, 5G and 6G are cross-sectional, top and bottom views, respectively, of encapsulant slot 240 formed in carrier 210 by a wet chemical etch using photoresist layer 236 as an etch mask. Terminal 232 is located within (rather than extending into and outside) encapsulant slot 240 and is spaced from the periphery of encapsulant slot 240 by 15 microns.

Figure 4H:
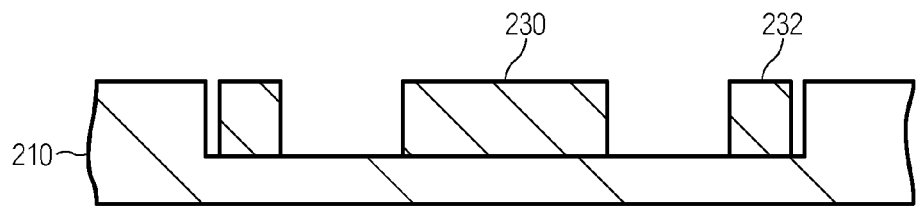
Figure 5H:
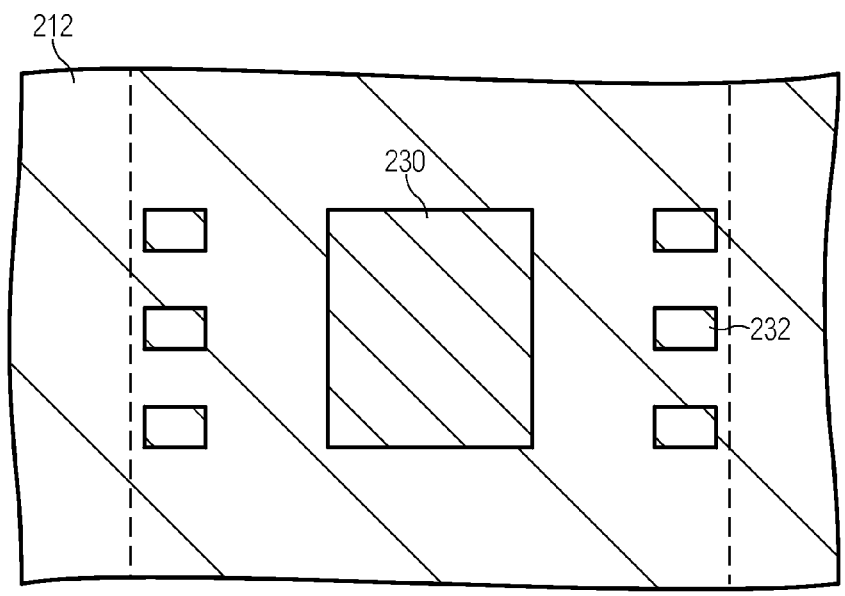
Figure 6H:
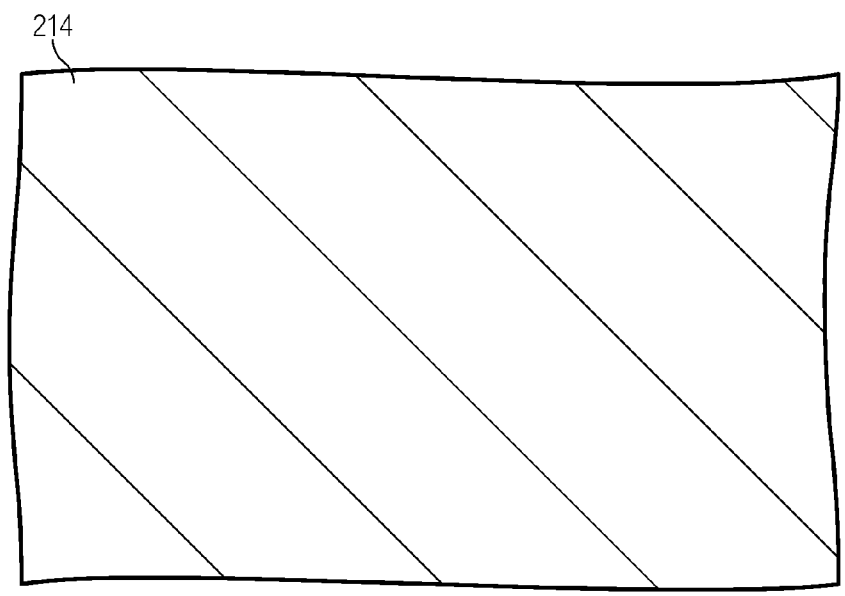

FIGS. 4H, 5H and 6H are cross-sectional, top and bottom views, respectively, of carrier 210, post 230 and terminal 232 after photoresist layers 234 and 236 are removed from carrier 210.

Figure 4I:
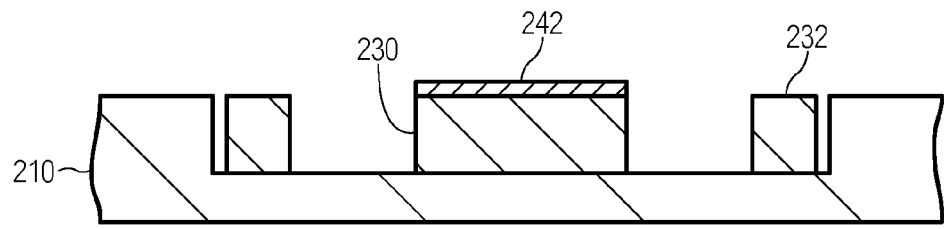
Figure 5I:
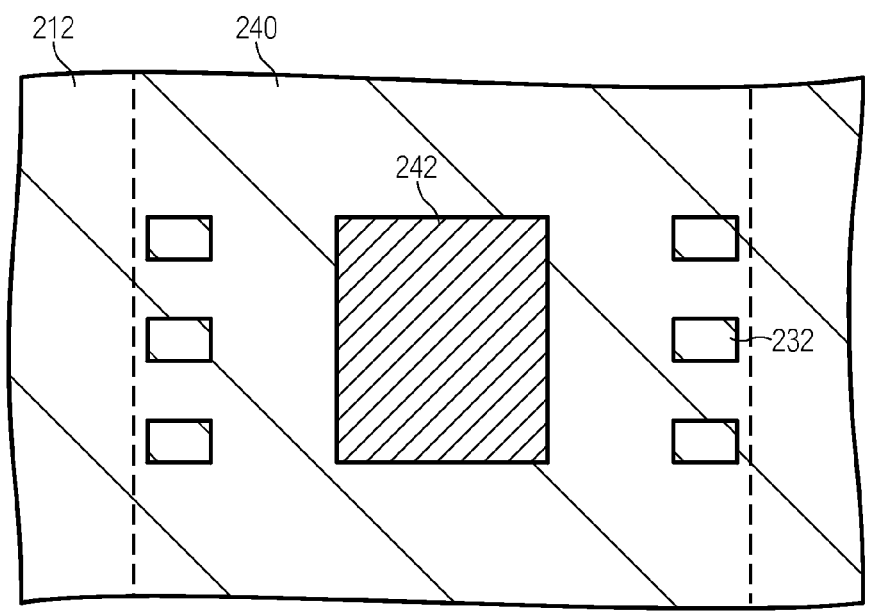
Figure 6I:
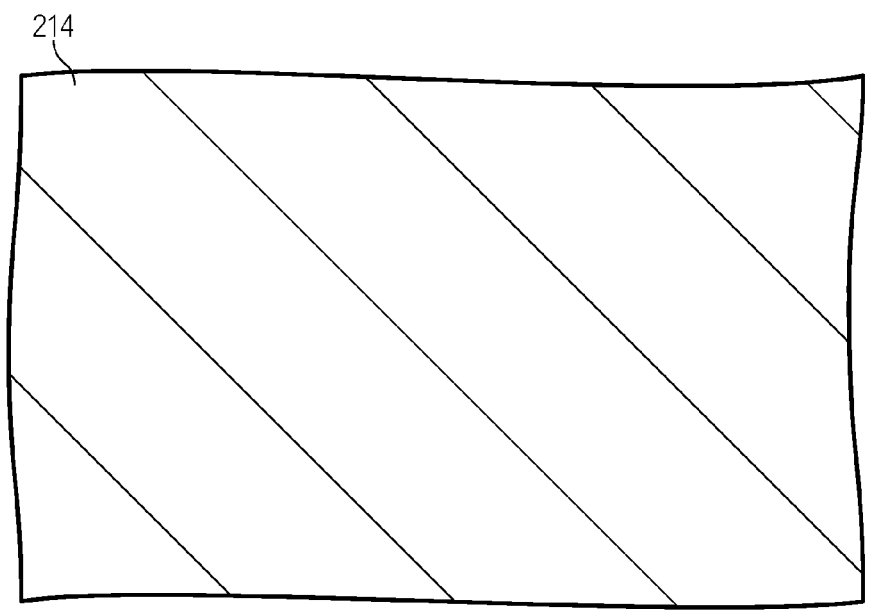

FIGS. 4I, 5I and 6I are cross-sectional, top and bottom views, respectively, of adhesive 242 formed on post 230.

Figure 4J:
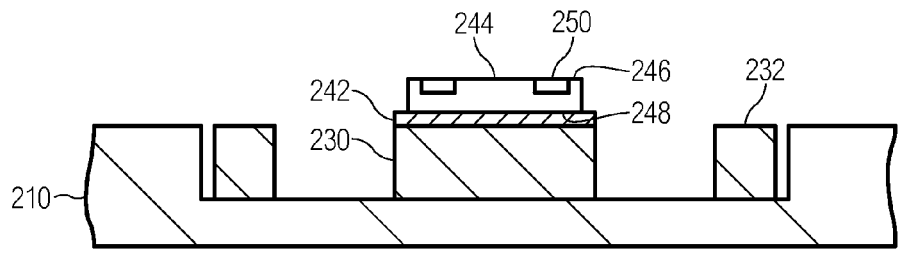
Figure 5J:
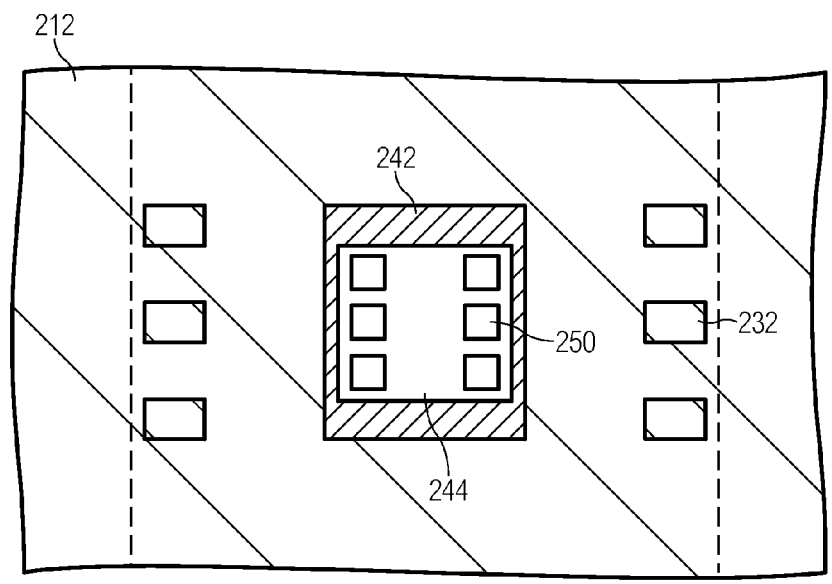
Figure 6J:
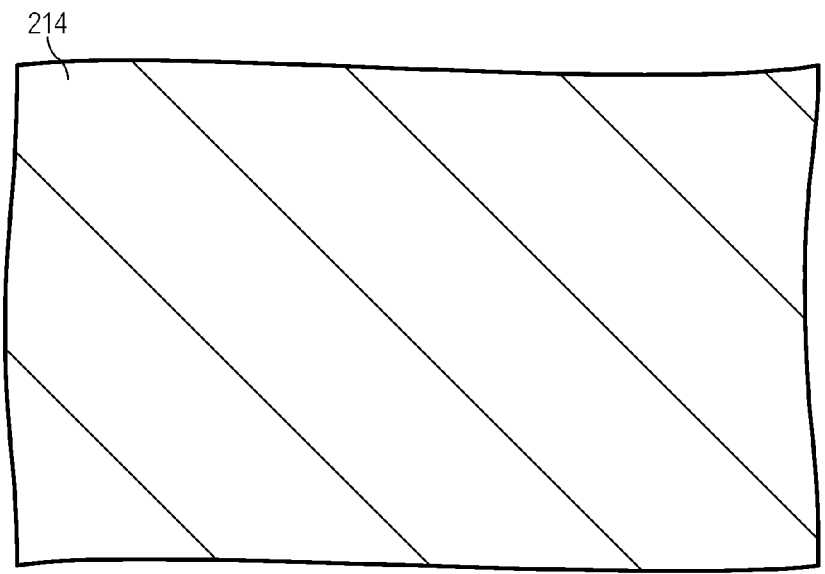

FIGS. 4J, 5J and 6J are cross-sectional, top and bottom views, respectively, of chip 244 mechanically attached to post 230 by adhesive 242.

Figure 4K:
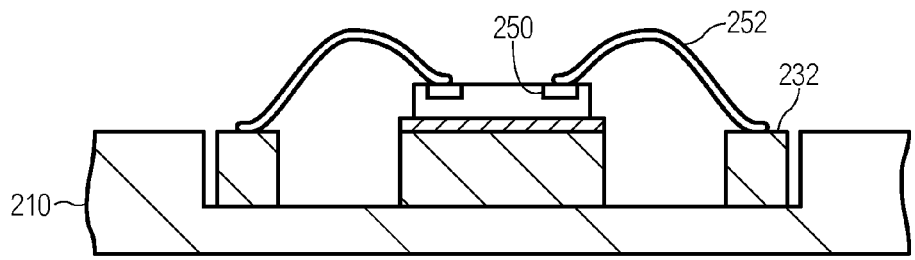
Figure 5K:
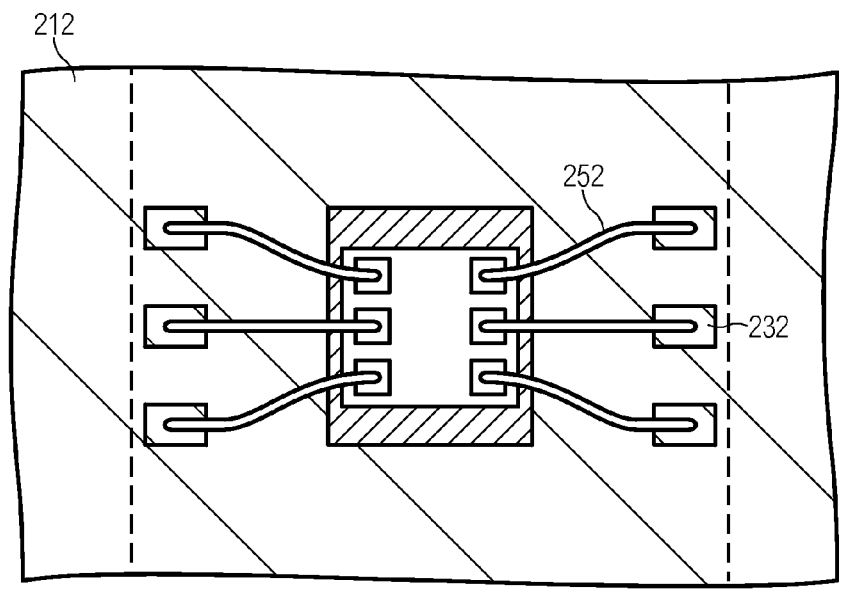
Figure 6K:
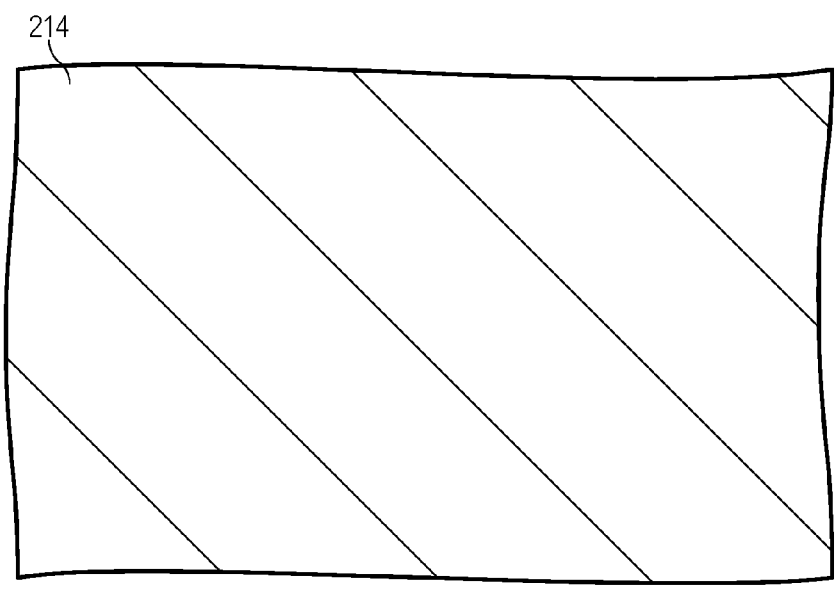

FIGS. 4K, 5K and 6K are cross-sectional, top and bottom views, respectively, of wire bond 252 formed on terminal 232 and chip pad 250.

Figure 4L:
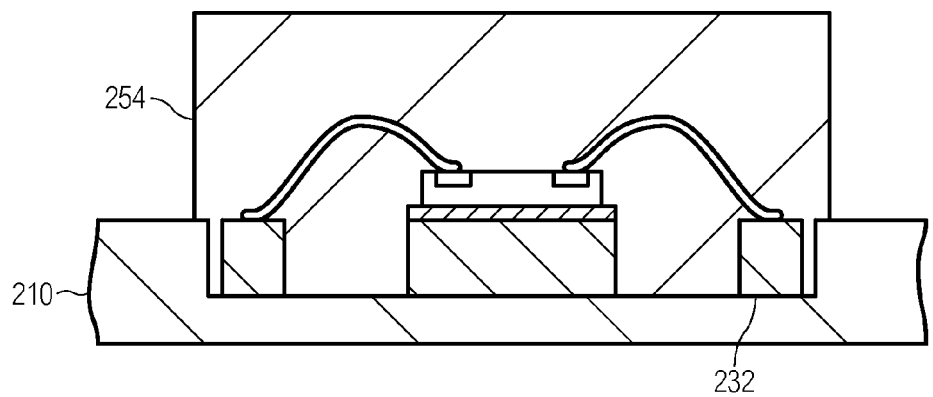
Figure 5L:
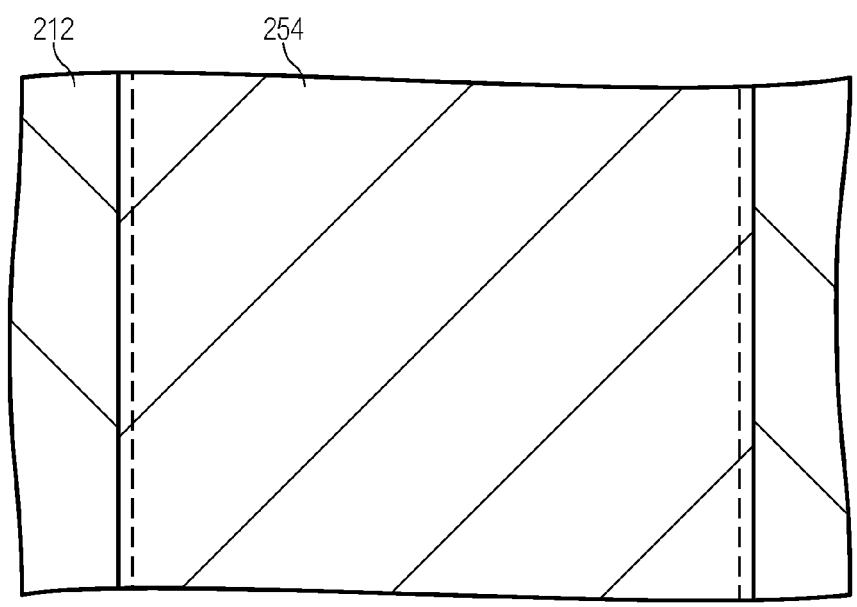
Figure 6L:
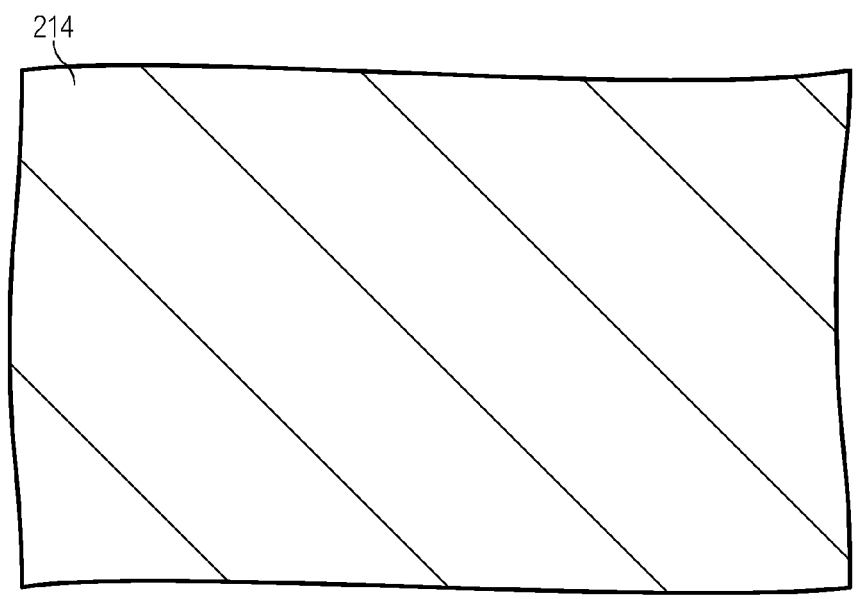

FIGS. 4L, 5L and 6L are cross-sectional, top and bottom views, respectively, of encapsulant 254 formed on carrier 210, post 230, terminal 232, adhesive 242, chip 244 and wire bond 252 by transfer molding. Encapsulant 254 covers post 230, terminal 232, adhesive 242, chip 244 and wire bond 252 and fills the remaining space in encapsulant slot 240. Encapsulant 254 laterally extends 65 microns past terminal 232. As a result, terminal 232 extends into encapsulant 254 in encapsulant slot 240, is located within the periphery of encapsulant 254 in encapsulant slot 240, is embedded in encapsulant 254 in encapsulant slot 240, its upper and side surfaces contact encapsulant 254 and its lower surface continues to contact carrier 210.

Figure 4M:
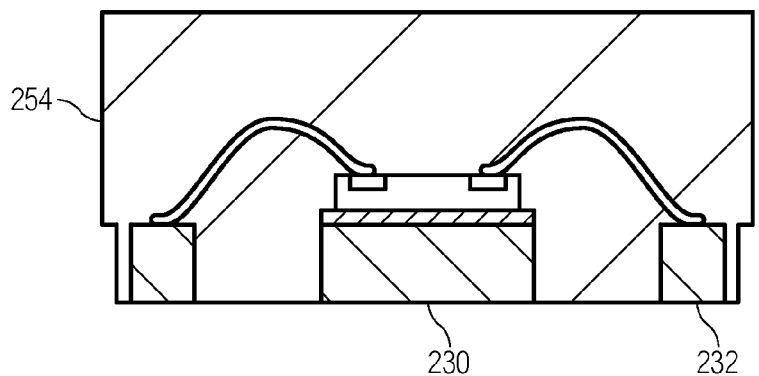
Figure 5M:
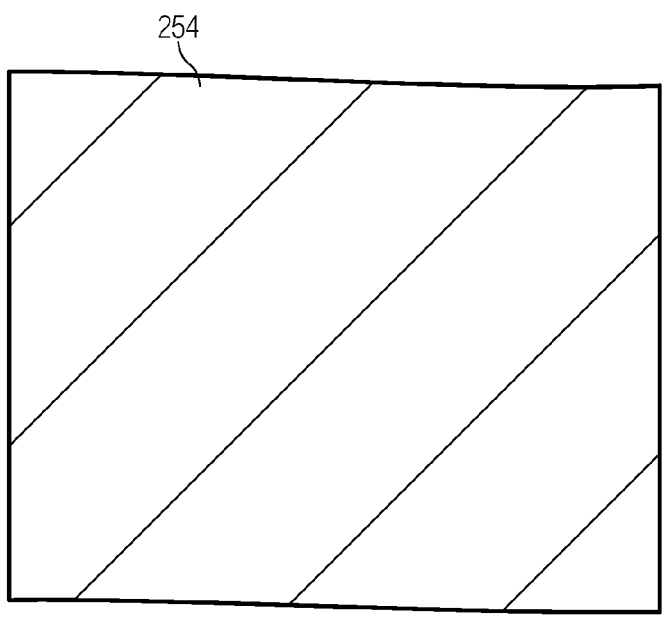
Figure 6M:
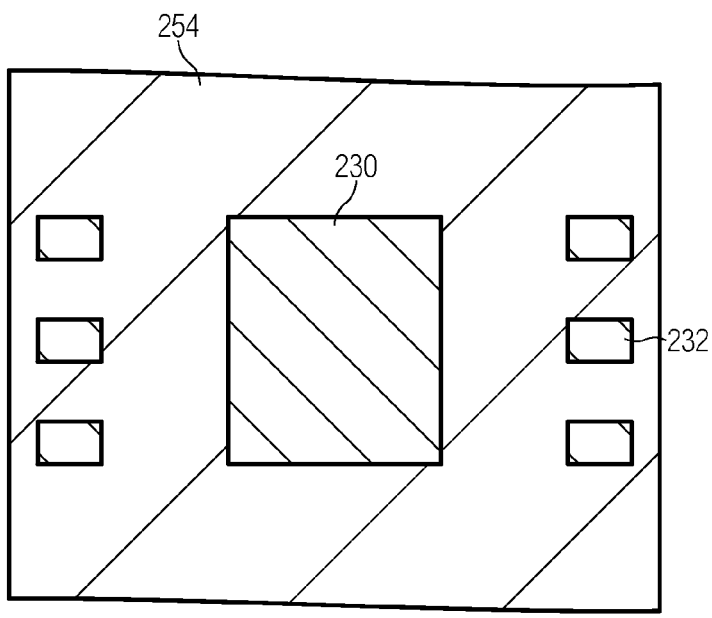

FIGS. 4M, 5M and 6M are cross-sectional, top and bottom views, respectively, of post 230, terminal 232, adhesive 242, chip 244, wire bond 252 and encapsulant 254 after carrier 210 is removed from post 230, terminal 232 and encapsulant 254 by a wet chemical etch, thereby exposing post 230, terminal 232 and encapsulant 254 in the downward direction.

Figure 4N:
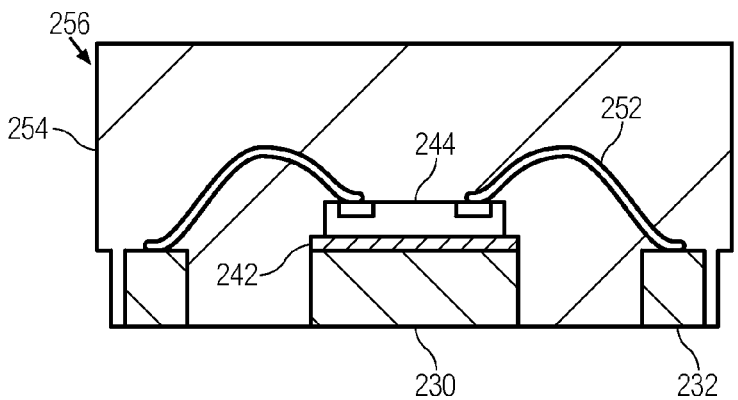
Figure 5N:
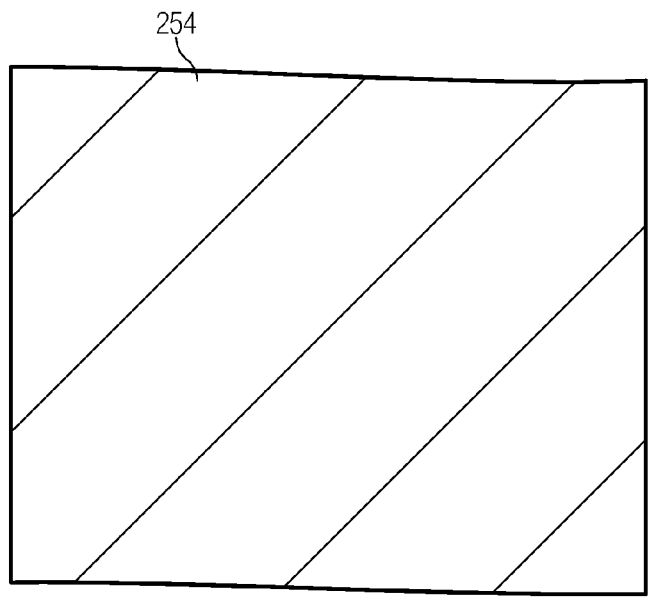
Figure 6N:
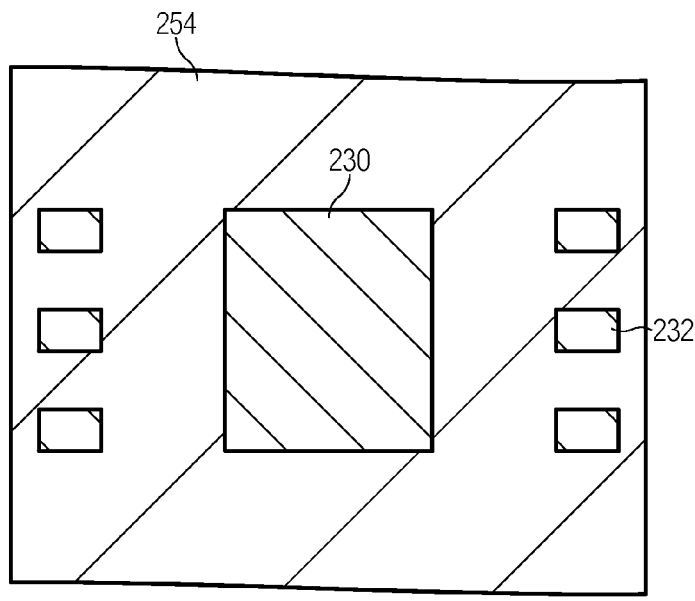

FIGS. 4N, 5N and 6N are cross-sectional, top and bottom views, respectively, of semiconductor package 256 that includes post 230, terminal 232, adhesive 242, chip 244, wire bond 252 and encapsulant 254 after encapsulant 254 is sawed with an excise blade at to singulate semiconductor package 256 from other semiconductor packages.

Semiconductor package 256 is a single-chip first-level leadless package in which terminal 232 extends into and is embedded in but does not protrude from encapsulant 254.

The semiconductor packages and manufacturing methods described above are merely exemplary. Numerous other embodiments are contemplated.

The carrier can be various metals such as copper, nickel, silver, gold, aluminum, alloys thereof and layers thereof as well as other materials such as plastic, rubber and paper.

The post slot and the terminal slot can be formed in the carrier by various additive techniques such as electroplating and subtractive techniques such as wet chemical etching and stamping. The post slot and the terminal slot can be formed simultaneously or sequentially and can have the same or different depths.

The post and the terminal can be various metals such as copper, nickel, silver, gold, aluminum, solder, alloys thereof and layers thereof provided they differ from the carrier so that a subsequent etch to provide the encapsulant slot and/or remove the carrier is selective of the carrier with respect to the post and the terminal. The post and the terminal can be deposited into the post slot and the terminal slot by various techniques such as electroplating, electroless plating, printing and chemical vapor deposition. The post and the terminal can be formed simultaneously or sequentially, can be the same or different materials and can have the same or different heights. Furthermore, the post and the terminal can but need not be coplanar with the upper surface of the carrier and with one another. Preferably, substantially all of the post is located within the post slot and substantially all of the post slot is filled by the post, and substantially all of the terminal is located within the terminal slot and substantially all of the terminal slot is filled by the terminal.

The adhesive can be various die attach materials such as epoxy, solder, glue and tape. The chip can be mechanically attached to the post and electrically connected to the terminal by various techniques such as wire bonding and solder reflow. The encapsulant can be various electrical insulators such as plastic, polyimide and epoxy, can include a filler such as silicon dioxide to match its thermal expansion coefficient with the chip, can be deposited on the carrier and into the encapsulant slot by various techniques such as transfer molding, compression molding and printing, and can be singulated along two sides that extend lengthwise (for leaded and leadless packages) or four sides (for leadless packages). The carrier can be removed from the post, the terminal and the encapsulant by various techniques such as wet chemical etching and mechanical displacement.

The semiconductor package can have a wide variety of shapes, sizes and terminals and be a single-chip package or a multi-chip package.

The semiconductor package can be manufactured individually or as a batch with multiple packages. For instance, during batch manufacturing, post slots and terminal slots for multiple packages can be simultaneously etched in the carrier, then posts and terminals for the multiple packages can be simultaneously electroplated in the corresponding post slots and terminal slots, then separate spaced adhesives for the respective packages can be selectively disposed on the corresponding posts, then chips can be disposed on the corresponding adhesives, then the adhesives can be simultaneously fully cured, then wire bonds can be formed on the corresponding terminals and chip pads, then the encapsulant can be formed, then the carrier can be etched and removed, and then the encapsulant can be sawed to singulate the packages.

The semiconductor package manufacturing method of the present invention has numerous advantages. The semiconductor package has high performance, high reliability, low thickness and low manufacturing cost. Encapsulant flashes around the terminals are avoided and therefore deflashing such as chemical spraying and high pressure water jet blasting which risks package delamination is unnecessary. Encapsulant degating which risks gate chipping is unnecessary. Lead trimming which risks lead bending and wire bond delamination is unnecessary. The mold tool can accommodate a wide variety of leaded and leadless packages. The method can conveniently and flexibly batch manufacture leaded or leadless packages by merely adjusting the length of the terminal slot openings in a photoresist layer and/or adjusting the length of the encapsulant slot opening in a photoresist layer.

The above description and examples illustrate the preferred embodiments of the present invention, and it will be appreciated that various modifications and improvements can be made without departing from the scope of the present invention.

The invention claimed is:

1. A method of manufacturing a semiconductor package, comprising:
providing a carrier;
forming a post slot and a terminal slot in the carrier;
depositing a post in the post slot;
depositing a terminal in the terminal slot;
forming an encapsulant slot in the carrier by:
depositing a photoresist layer over a surface of the carrier, wherein the photoresist layer includes an encapsulant slot opening that exposes the post and at least a portion of the terminal;
applying a wet chemical etch that is highly selective of the carrier with respect to the post and the terminal through the encapsulant slot opening to the carrier, the post and the terminal, thereby selectively removing a portion of the carrier to form the encapsulant slot without appreciably affecting the post and the terminal; and then
removing the photoresist layer from the carrier, wherein the post extends into and is located within a periphery of the encapsulant slot and the terminal extends into the encapsulant slot;
mechanically attaching a semiconductor chip to the post;
electrically connecting the semiconductor chip to the terminal;
depositing an encapsulant in the encapsulant slot; and
removing the carrier from the terminal.

2. The method of claim 1, wherein forming the post slot and the terminal slot includes applying a wet chemical etch to the carrier.

3. The method of claim 1, wherein depositing the post and the terminal includes electroplating the post and the terminal on the carrier.

4. The method of claim 1, wherein mechanically attaching the semiconductor chip to the post includes providing an adhesive between and in contact with the semiconductor chip and the post.

5. The method of claim 1, wherein electrically connecting the semiconductor chip to the terminal includes providing a wire bond between and in contact with the semiconductor chip and the terminal.

6. The method of claim 1, wherein depositing the encapsulant includes transfer molding the encapsulant on the semiconductor chip, the post, the terminal and the carrier.

7. The method of claim 1, wherein removing the carrier includes applying a wet chemical etch to the carrier.

8. The method of claim 1, wherein the terminal extends outside the periphery of the encapsulant in the encapsulant slot, the semiconductor package is a leaded package and the terminal is an external lead that protrudes from the encapsulant.

9. The method of claim 1, wherein the terminal is located within the periphery of the encapsulant in the encapsulant slot, the semiconductor package is a leadless package and the terminal is an external pad that does not protrude from the encapsulant.

10. A method of manufacturing a semiconductor package, comprising:
providing a carrier that includes first and second opposing major surfaces, wherein the first surface of the carrier faces in a first direction, the second surface of the carrier faces in a second direction opposite the first direction, and the first and second directions are orthogonal to a lateral direction; then
forming a post slot and a terminal slot in the carrier, wherein the post slot and the terminal slot extend into and partially through the carrier at the first surface of the carrier, are spaced from the second surface of the carrier and are laterally spaced from one another;
depositing a post in the post slot;
depositing a terminal in the terminal slot, wherein the post and the terminal are spaced from the second surface of the carrier and laterally spaced from one another; then
forming an encapsulant slot in the carrier by:
depositing a photoresist layer over the first surface of the carrier, wherein the photoresist layer includes an encapsulant slot opening that exposes the post and at least a portion of the terminal;
applying a wet chemical etch that is highly selective of the carrier with respect to the post and the terminal through the encapsulant slot opening to the carrier, the post and the terminal, thereby selectively removing a portion of the carrier to form the encapsulant slot without appreciably affecting the post and the terminal; and then
removing the photoresist layer from the carrier, wherein the encapsulant slot extends into and partially through the carrier at the first surface of the carrier, is spaced from the second surface of the carrier and includes a periphery that defines a lateral surface area, the post extends into the encapsulant slot and is located within the periphery of the encapsulant slot, and the terminal extends into the encapsulant slot; then
mechanically attaching a semiconductor chip to the post, wherein the semiconductor chip includes first and second opposing major surfaces, and the first surface of the semiconductor chip includes a chip pad that transfers an electrical signal between the semiconductor chip and external circuitry during operation of the semiconductor chip;
electrically connecting the chip pad to the terminal; then
depositing an encapsulant in the encapsulant slot, wherein the encapsulant protects the semiconductor chip, contacts the semiconductor chip, the post, the terminal and the carrier, extends beyond the semiconductor chip, the post, the terminal and the carrier in the first direction, fills remaining space in the encapsulant slot and is electrically insulative; and then
removing the carrier from the post, the terminal and the encapsulant, thereby exposing the post, the terminal and the encapsulant in the second direction.

11. The method of claim 10, wherein forming the post slot and the terminal slot includes:
depositing a photoresist layer over the first surface of the carrier, wherein the photoresist layer includes a post slot opening and a terminal slot opening that expose the first surface of the carrier;
applying a wet chemical etch that is highly selective of the carrier through the post slot opening and the terminal slot opening to the carrier, thereby selectively removing laterally spaced portions of the carrier; and then removing the photoresist layer from the carrier.

12. The method of claim 10, wherein depositing the post and the terminal includes:

depositing a photoresist layer over the first surface of the carrier, wherein the photoresist layer includes a post opening that exposes the post slot and a terminal opening that exposes the terminal slot;

depositing the post through the post opening into the post slot and the terminal through the terminal opening into the terminal slot by electroplating using the carrier as a plating base; and then removing the photoresist layer from the carrier.

13. The method of claim 10, wherein mechanically attaching the semiconductor chip to the post includes:

depositing an adhesive in an uncured stage on the post;

depositing the semiconductor chip on the adhesive in the uncured stage; and then curing the adhesive such that the adhesive is hardened and contacts and is sandwiched between and rigidly attaches the semiconductor chip and the post.

14. The method of claim 10, wherein electrically connecting the chip pad to the terminal includes providing a wire bond that contacts the chip pad and the terminal.

15. The method of claim 10, wherein depositing the encapsulant includes transfer molding the encapsulant on the semiconductor chip, the post, the terminal and the carrier.

16. The method of claim 10, wherein removing the carrier includes applying a wet chemical etch that is highly selective of the carrier with respect to the post, the terminal and the encapsulant, the wet chemical etch being applied to the carrier, the post, the terminal and the encapsulant, the wet chemical etch thereby removing the carrier from the post, the terminal and the encapsulant without appreciably affecting the post, the terminal and the encapsulant and exposing the post, the terminal and the encapsulant in the second direction without exposing the semiconductor chip.

17. The method of claim 10, wherein the terminal extends outside the periphery of the encapsulant in the encapsulant slot, the semiconductor package is a leaded package, and the terminal is an external lead that laterally protrudes from the encapsulant.

18. The method of claim 10, wherein the terminal is located within the periphery of the encapsulant in the encapsulant slot, the semiconductor package is a leadless package, and the terminal is an external pad that does not protrude from the encapsulant.

19. A method of manufacturing a semiconductor package, comprising:

providing a carrier that includes first and second surfaces, wherein the first and second surfaces of the carrier are major and opposing surfaces, wherein the first surface of the carrier faces in a first direction, the second surface of the carrier faces in a second direction opposite the first direction, and the first and second directions are orthogonal to a lateral direction; then forming a post slot and a terminal slot in the carrier, wherein the post slot and the terminal slot extend into and partially through the carrier at the first surface of the carrier, are spaced from the second surface of the carrier and are laterally spaced from one another;

depositing a post in the post slot, wherein the post includes first and second surfaces, wherein the first and second surfaces of the post are major and opposing surfaces, the first surface of the post faces in the first direction, the second surface of the post faces in the second direction, the first surfaces of the carrier and the post are substantially coplanar with one another, substantially all of the post is located within the post slot, and substantially all of the post slot is filled by the post;

depositing a terminal in the terminal slot, wherein the terminal includes first and second surfaces, wherein the first and second surfaces of the terminal are major and opposing, the first surface of the terminal faces in the first direction, the second surface of the terminal faces in the second direction, the first surfaces of the carrier and the terminal are substantially coplanar with one another, substantially all of the terminal is located within the terminal slot, substantially all of the terminal slot is filled by the terminal, the first surfaces of the post and the terminal are substantially coplanar with one another, the second surfaces of the post and the terminal are substantially coplanar with one another, and the post and the terminal are spaced from the second surface of the carrier and laterally spaced from one another; then forming an encapsulant slot in the carrier, wherein the encapsulant slot extends into and partially through the carrier at the first surface of the carrier, is spaced from the second surface of the carrier and includes a periphery that defines a lateral surface area, the post is located within the periphery of the encapsulant slot, substantially all of the post is located within the encapsulant slot, and the terminal extends into the encapsulant slot; then mechanically attaching a semiconductor chip to the post, wherein the semiconductor chip includes first and second surfaces, wherein the first and second surfaces of the semiconductor chip are major and opposing, the first surface of the semiconductor chip includes a chip pad that transfers an electrical signal between the semiconductor chip and external circuitry during operation of the semiconductor chip, the semiconductor chip is located within the periphery of the encapsulant slot, and substantially all of the semiconductor chip is located outside the encapsulant slot;

electrically connecting the chip pad to the terminal; then depositing an encapsulant in the encapsulant slot, wherein the encapsulant protects the semiconductor chip, contacts the semiconductor chip, the post, the terminal and the carrier, extends beyond the semiconductor chip, the post, the terminal and the carrier in the first direction, fills remaining space in the encapsulant slot and is electrically insulative; and then removing the carrier from the post, the terminal and the encapsulant, thereby exposing the post, the terminal and the encapsulant in the second direction without exposing the semiconductor chip.

20. The method of claim 19, wherein:

forming the post slot and the terminal slot includes applying a first wet chemical etch that is highly selective of the carrier to the carrier;

depositing the post and the terminal includes electroplating the post and the terminal on the carrier;

forming the encapsulant slot includes applying a second wet chemical etch that is highly selective of the carrier with respect to the post and the terminal to the carrier, the post and the terminal;

mechanically attaching the semiconductor chip to the post includes providing an adhesive between and in contact with the semiconductor chip and the post;

electrically connecting the chip pad to the terminal includes providing a wire bond that contacts the chip pad and the terminal;

depositing the encapsulant includes transfer molding the encapsulant on the semiconductor chip, the post, the terminal and the carrier; and removing the carrier includes applying a third wet chemical etch that is highly selective of the carrier with respect to the post, the terminal and the encapsulant to the carrier, the post, the terminal and the encapsulant.

21. The method of claim 19, including sawing the encapsulant after removing carrier, thereby singulating the semiconductor package from another semiconductor package.

22. The method of claim 19, wherein the terminal extends outside the periphery of the encapsulant in the encapsulant slot, the semiconductor package is a leaded package, and the terminal is an external lead that laterally protrudes from the encapsulant.

23. The method of claim 19, wherein the terminal is located within the periphery of the encapsulant in the encapsulant slot, the semiconductor package is a leadless package, and the terminal is an external pad that does not protrude from the encapsulant.

\* \* \* \* \*